United States Patent

Kinugasa et al.

[11] Patent Number: 5,841,389
[45] Date of Patent: Nov. 24, 1998

[54] TWO-STEP PARALLEL A/D CONVERTER

[75] Inventors: Norihide Kinugasa, Kyoto; Mitsuhiko Otani, Hyogo; Katsumi Hironaka; Shinichi Ogita, both of Osaka, all of Japan

[73] Assignee: Matsushita Electric Industrial Co., Ltd., Osaka, Japan

[21] Appl. No.: 833,965

[22] Filed: Apr. 11, 1997

[30] Foreign Application Priority Data

Apr. 16, 1996 [JP] Japan .................................. 8-093916
Jul. 22, 1996 [JP] Japan .................................. 8-192263

[51] Int. Cl.⁶ .................................................. H03M 1/36
[52] U.S. Cl. ........................................ 341/159; 341/155
[58] Field of Search .................................. 341/159, 156, 341/161

[56] References Cited

U.S. PATENT DOCUMENTS 5,019,420  5/1991  Matsuzawa et al. .................... 341/156

FOREIGN PATENT DOCUMENTS 5-110437  4/1993  Japan .

OTHER PUBLICATIONS

A. Matsuzawa et al., "10–bit Bi–CMOS A/D Converter An813OK for Hi–Vision", National Technical Report, vol. 36, No. 4, Aug. 1990, pp. 383–392.

Primary Examiner—Brian Young
Attorney, Agent, or Firm—McDermott, Will & Emery

[57] ABSTRACT

Provided is a two-step parallel A/D converter capable of operating at a higher speed than in the prior art and easily performing correction of upper bit data. An upper limit voltage $V_H$ of a voltage range for lower bit conversion is amplified on the basis of a median voltage $V_M$ of the voltage range by a second differential amplifier, and the amplified voltage is set to a high level reference voltage $SUB_H$ for lower bit conversion. A lower limit voltage $V_L$ of the voltage range is amplified on the basis of the median voltage $V_M$ by a third differential amplifier, and the amplified voltage is set to a low level reference voltage $SUB_L$ for lower bit conversion. A voltage $V_{IN}$ of an input analog signal is amplified on the basis of the voltage $V_M$ by a first differential amplifier, and lower bit data is obtained from a position between the voltage $SUB_H$ and the voltage $SUB_L$ which is occupied by an obtained voltage $SUB_{IN}$. The voltages $SUB_H$ and $SUB_L$ are not changed by the voltage $V_{IN}$ of the input analog signal. Consequently, a settling time can be shortened more than in the prior art.

18 Claims, 23 Drawing Sheets

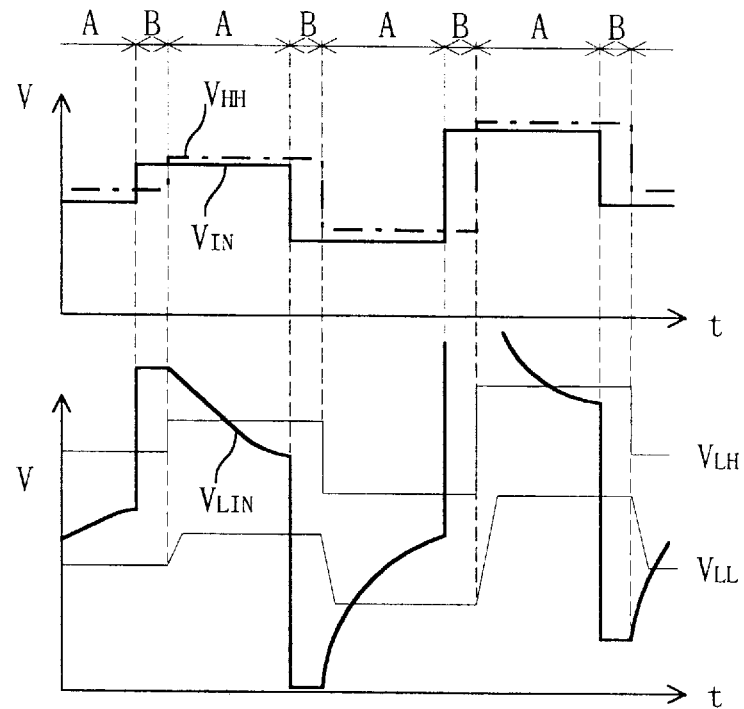
Fig. 20(a)
Fig. 20(b)
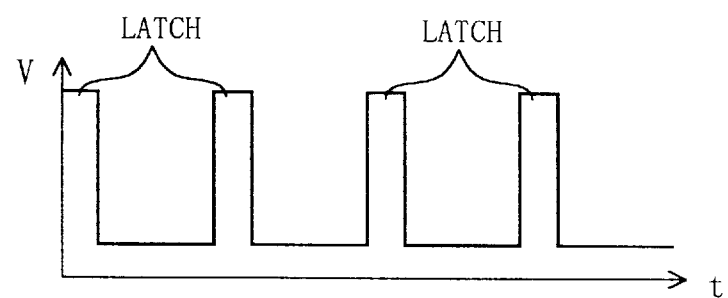
Fig. 20(c)

TWO-STEP PARALLEL A/D CONVERTER

BACKGROUND OF THE INVENTION

The present invention relates to an A/D converter for converting an analog signal into a digital signal, and more particularly to a two-step parallel A/D converter for dividing an A/D converting processing into a plurality of steps.

FIG. 13 is a circuit diagram showing a whole structure of a two-step parallel A/D converter according to the prior art. FIG. 13 shows a 4-bit two-step parallel A/D converter having upper 2 bits and lower 2 bits (lower 3 bits including a correction bit which will be described below).

In FIG. 13, the reference numeral 1 denotes an input terminal to which a voltage $V_{IN}$ of a sampled and held input analog signal to be A/D converted is applied, the reference numeral 2 denotes a terminal to which a high level reference voltage $V_{RT}$ is applied, the reference numeral 3 denotes a terminal to which a low level reference voltage $V_{RB}$ is applied, and the reference numeral 4 denotes an output terminal of 4-bit digital signals $D_0$ to $D_3$ obtained as a result of the A/D conversion.

The reference numeral 51 denotes an upper resistor string including 8 ($=2^3$) resistors $R_{U1}$ to $R_{U8}$ that are connected in series and have the same resistance value, the reference numeral 52 denotes a differential converter string including 4 ($=2^2$) differential converters $DEA_1$ to $DEA_4$, the reference numeral 53 denotes a switch circuit including 4 ($=2^2$) switches $SW_1$ to $SW_4$, the reference numeral 54 denotes an upper comparator string including 3 ($=2^2-1$) comparators $CM_{U1}$ to $CM_{U3}$, and the reference numeral 55 denotes an upper encoder, which form an upper bit converting section. The reference numeral 56 denotes a lower resistor string including 8 ($=2^3$) resistors $R_{L1}$ to $R_{L8}$ that are connected in series and have the same resistance value, the reference numeral 57 denotes a lower comparator string including 7 ($=2^3-1$) comparators $CM_{L1}$ to $CM_{L7}$, and the reference numeral 58 denotes a lower encoder, which form a lower bit converting section. The reference numeral 59 denotes a correcting circuit for correcting upper bit data, and the reference numeral 60 denotes a lower-upper buffer.

The input terminal 1 is connected to − side input terminals of the differential converters $DEA_1$ to $DEA_4$ forming the differential converter string 52, + side input terminals of the comparators $CM_{U1}$ to $CM_{U3}$ forming the upper comparator string 54, and + side input terminals of the comparators $CM_{L1}$ to $CM_{L7}$ forming the lower comparator string 57.

The upper resistor string 51 has 7 ($=2^3-1$) dividing points among the resistors, and divides a voltage between the high level reference voltage $V_{RT}$ applied to the terminal 2 and the low level reference voltage $V_{RB}$ applied to the terminal 3. The odd-numbered dividing points of the upper resistor string 51 are connected to + side input terminals of the differential converters $DEA_1$ to $DEA_4$, and the even-numbered dividing points thereof are connected to − side input terminals of the comparators $CM_{U1}$ to $CM_{U3}$.

The switch circuit 53 selects three adjacent differential converters $DEA_N$, $DEA_{N+1}$ and $DEA_{N+2}$ in response to output signals of the upper comparator string 54, and outputs, to the lower resistor string 56, output voltages of the differential converters $DEA_{N+2}$, $DEA_{N+1}$ and $DEA_N$ as a high level reference voltage $SUB_H$, a median reference voltage $SUB_M$ and a low level reference voltage $SUB_L$ for lower bit conversion, respectively.

The lower resistor string 56 has 7 ($=2^3-1$) dividing points among the resistors, and divides a voltage between the high level reference voltage $SUB_H$ and the low level reference voltage $SUB_L$ output from the switch circuit 53. Each dividing point of the lower resistor string 56 is connected to a − side input terminal of each of the comparators $CM_{L1}$ to $CM_{L7}$ forming the lower comparator string 57.

The upper encoder 55 converts an output signal of the upper comparator string 54 into upper bit data. The lower encoder 58 converts an output signal of the lower comparator string 57 into lower bit data. The correcting circuit 59 corrects the upper bit data output from the upper encoder 55 by using the lower bit data output from the lower encoder 58.

The lower-upper buffer 60 adds the lower bit data output from the lower encoder 58 and the upper bit data corrected by the correcting circuit 59 to form 4-bit data $D_0$ to $D_3$ to be output to the output terminal 4.

The comparators $CM_{U1}$ to $CM_{U3}$ forming the upper comparator string 54 operate in response to a clock signal CKU, and the comparators $CM_{L1}$ to $CM_{L7}$ forming the lower comparator string 57 operate in response to a clock signal CKL. The lower-upper buffer 60 operates in response to a rise of a clock signal CLK.

Operation of the two-step parallel A/D converter having the above-mentioned structure will be described below.

First of all, operation of the upper bit converting section will be described below. It is assumed that the voltage $V_{IN}$ of the input signal is between a voltage of the dividing point connected to the − side input terminal of the comparator $CM_{U1}$ (the dividing point between the resistors $R_{U2}$ and $R_{U3}$) and a voltage of the dividing point connected to the − side input terminal of the comparator $CM_{U2}$ (the dividing point between the resistors $R_{U4}$ and $R_{U5}$).

In this case, the output signal of the comparator $CM_{U1}$ is set to the "H" level, the output signals of the comparators $CM_{U2}$ and $CM_{U3}$ are set to the "L" level and the output signals of the upper comparator string 54 are converted into the upper bit data by the upper encoder 55.

The switch circuit 53 controls the switches $SW_1$ to $SW_4$ in such a manner that the output voltages of the differential converters $DEA_1$, $DEA_2$ and $DEA_3$ are output as the reference voltages $SUB_L$, $SUB_M$ and $SUB_H$ for lower bit conversion in response to the output signals of the upper comparator string 54, respectively. Consequently, the output voltage of the differential converter $DEA_3$ is applied as the high level reference voltage $SUB_H$ to the lower resistor string 56, the output voltage of the differential converter $DEA_2$ is applied as the median reference voltage $SUB_M$ to a central dividing point (the dividing point between the resistors $R_{L4}$ and $R_{L5}$), and the output voltage of the differential converter $DEA_1$ is applied as the low level reference voltage $SUB_L$.

Next, operation of the low bit converting section will be described below. The lower resistor string 56 divides a portion between the high level reference voltage $SUB_H$ and the median reference voltage $SUB_M$ by $2^2$ resistors, and divides a portion between the median reference voltage $SUB_M$ and the low level reference voltage $SUB_L$ by $2^2$ resistors. In other words, a portion between the high level reference voltage $SUB_M$ and the low level reference voltage $SUB_L$ is divided by $2^3$ resistors. The comparators $CM_{L1}$ to $CM_{L7}$ forming the lower comparator string 57 compare a voltage of each dividing point of the lower resistor string 56 with the voltage $V_{IN}$ of the input signal, and outputs a signal indicative of a result of comparison. The lower encoder 58 converts the output signals of the lower comparator string 57 into lower bit data.

FIG. 14 is a circuit diagram showing a structure of another two-step parallel A/D converter according to the prior art.

The two-step parallel A/D converter shown in FIG. 14 is broadly formed by an upper bit converting section, a lower bit converting section and an output section. In FIG. 14, the reference numeral 151 denotes an analog signal input terminal, the reference numeral 152 denotes a high level reference voltage terminal for upper bit conversion, the reference numeral 153 denotes a low level reference voltage terminal for upper bit conversion, the reference numeral 154 denotes a sample-and-hold circuit, the reference numeral 155 denotes a tap resistor for upper bit conversion, the reference numeral 156 denotes a comparator for upper bit conversion, the reference numeral 157 denotes an analog switch, the reference numeral 158 denotes an upper bit coding circuit, the reference numeral 159 denotes a high level reference voltage terminal for lower bit conversion, the reference numeral 160 denotes a low level reference voltage terminal for lower bit conversion, the reference numeral 161 denotes a tap resistor for lower bit conversion, the reference numeral 162 denotes a comparator for lower bit conversion, the reference numeral 163 denotes a lower bit coding circuit, the reference numeral 164 denotes an output buffer circuit, the reference numeral 165 denotes a digital signal output terminal, the reference numeral 171 denotes a first subtraction amplifying circuit, and the reference numeral 172 denotes a second subtraction amplifying circuit (see Japanese Unexamined Patent Publication No. 5-110437).

Operation of the conventional two-step parallel A/D converter shown in FIG. 14 will be described below.

An analog signal input to the analog signal input terminal 151 is sampled by the sample-and-hold circuit 154, and held at a constant voltage from an upper bit A/D converting period to a lower bit A/D converting period. The comparator for upper bit conversion 156 compares each reference voltage signal obtained by dividing a voltage between the high level reference voltage terminal for upper bit conversion 152 and the low level reference voltage terminal for upper bit conversion 153 by the tap resistor for upper bit conversion 155 with a voltage of the analog signal held by the sample-and-hold circuit 154 to obtain a reference voltage range to which the voltage of the analog signal belongs. In accordance with this result, the analog signal is coded as an upper bit digital value by the upper bit coding circuit 158.

In order to obtain more subdivided digital values, the upper bit converting section transmits an upper limit voltage of the reference voltage range to which the voltage of the analog signal belongs to the high level reference voltage terminal for lower bit conversion 159, and, to the low level reference voltage terminal for lower bit conversion 160, a voltage obtained by amplifying a difference voltage between upper and lower limit voltages of the reference voltage range by means of the second subtraction amplifier 172.

The comparator for lower bit conversion 162 compares each reference voltage signal obtained by dividing a voltage between the high level reference voltage terminal for lower bit conversion 159 and the low level reference voltage terminal for lower bit conversion 160 by the tap resistor for lower bit conversion 161 with an input voltage of the lower bit converting section obtained by amplifying a difference voltage between the upper limit voltage of the reference voltage range and the voltage of the analog signal by the first subtraction amplifying circuit 171 to obtain a reference voltage range to which the same input voltage belongs. In accordance with this result, the analog signal is coded as a lower bit digital value by the coding circuit for lower bit conversion 163. The output buffer circuit 164 outputs, through the digital signal output terminal 165, the upper bit digital value coded by the upper bit coding circuit 158 and the lower bit digital value coded by the lower bit coding circuit 163.

However, the conventional two-step parallel A/D converter has the following problems.

In the conventional two-step parallel A/D converter, as shown in FIG. 13, the upper bit converting section includes the differential converter string 52 in addition to the upper comparator string 54. Upper and lower limit voltages of a voltage range including the voltage $V_{IN}$ of the input signal determined by the upper comparator string 54 are amplified on the basis of the voltage $V_{IN}$ respectively, and the amplified voltages are transmitted to the lower bit converting section.

FIG. 15 is a diagram for explaining how to expand a lower conversion range of the conventional two-step parallel A/D converter shown in FIG. 13. In FIG. 15, the reference numeral 51A denotes an upper resistor string, the reference numeral 52A denotes a differential converter string and the reference numeral 54A denotes an upper comparator string, in which only portions necessary for explanation are shown.

It is assumed that an input signal has a voltage $V_{IN}$ between a reference voltage $V_{c(n-1)}$ of an upper comparator $CM_{U(n-1)}$ and a reference voltage $V_{c(n)}$ of an upper comparator $CM_{U(n)}$. In this case, output signals of the upper comparator $CM_{U(n-1)}$ and comparators lower than the upper comparator $CM_{U(n-1)}$ are set to the "H" level, and those of the upper comparator $CM_{U(n)}$ and comparators higher than the upper comparator $CM_{U(n)}$ are set to the "L" level. Differential converters $DEA_{n-1}$, $DEA_n$ and $DEA_{n+1}$ are selected by a switch circuit 53.

At this time, the differential converter $DEA_{n-1}$ amplifies a dividing point voltage $V_{r(n-1)}$ on the lower adjacent side to a dividing point voltage $V_{c(n-1)}$ on the basis of the voltage $V_{IN}$ of the input signal, and outputs the amplified voltage as a low level reference voltage $SUB_L$. The differential converter $DEA_n$ amplifies a dividing point voltage $V_{r(n)}$ between the dividing point voltage $V_{c(n-1)}$ and $V_{c(n+1)}$ on the basis of the voltage $V_{IN}$ of the input signal, and outputs the amplified voltage as a median reference voltage $SUB_M$. The differential converter $DEA_{n+1}$ amplifies a dividing point voltage $V_{r(n+1)}$ on the upper adjacent side to the dividing point voltage $V_{c(n)}$ on the basis of the voltage $V_{IN}$ of the input signal, and outputs the amplified voltage as a high level reference voltage $SUB_H$.

For example, a 9-bit (upper 5 bits and lower 4 bits) two-step parallel A/D converter has 16 steps of a minimum unit ($V_{c(n)}-V_{c(n-1)}$) for upper bit conversion and 32 steps of a range ($Vr_{(n+1)}-V_{r(n-1)}$) for lower bit conversion as shown in FIG. 15. In FIG. 15, each differential converter has a double gain.

It is assumed that the voltage $V_{IN}$ of the input signal has a higher potential than that of the voltage $V_{r(n)}$ by 4 steps. Since a difference between the voltage $V_{r(n+1)}$ and the voltage $V_{IN}$ of the input signal is 12 steps, the high level reference voltage $SUB_H$ is generated to have a higher potential than the voltage $V_{IN}$ of the input signal by 24 steps. Since a difference between the voltage $V_{IN}$ of the input signal and the voltage $V_{r(n)}$ is 4 steps, a median reference voltage $SUB_M$ is generated to have a lower potential than that of the voltage $V_{IN}$ of the input signal by 8 steps. Furthermore, since a difference between the voltage $V_{IN}$ of the input signal and the voltage $V_{r(n-1)}$ is 20 steps, a low level reference voltage $SUB_L$ is generated to have a lower potential than that of the voltage $V_{IN}$ of the input signal by 40 steps.

In the two-step parallel A/D converter, thus, the reference voltages $SUB_H$, $SUB_M$ and $SUB_L$ transmitted to the lower bit converting section have constant differences, and are changed in response to the voltage $V_{IN}$ of the input signal. For this reason, the lower bit converting section has to wait for settling of the reference voltage before starting operation. Accordingly, it has been hard to increase a speed of A/D conversion.

In addition, the two-step parallel A/D converter according to the prior art has had a problem that complicated correction is necessary for upper bit data.

FIG. 16 is a diagram for explaining a mechanism for requiring the complicated correction for the upper bit data in the two-step parallel A/D converter according to the prior art, and showing the two-step parallel A/D converter having upper 2 bits in FIG. 13. In FIG. 16, the reference numeral 51 denotes an upper resistor string, and the reference numeral 54 denotes an upper comparator string.

As shown in FIG. 16, upper bit data is "0" when the voltage $V_{IN}$ of the input signal is lower than the reference voltage $V_{c1}$ of the upper comparator $CM_{U1}$. Similarly, the upper bit data is "1" when the voltage $V_{IN}$ of the input signal is higher than the voltage $V_{c1}$ and is lower than a reference voltage $V_{c2}$ of the upper comparator $CM_{U2}$, the upper bit data is "2" when the voltage $V_{IN}$ of the input signal is higher than the voltage $V_{c2}$ and is lower than a reference voltage $V_{c3}$ of the upper comparator $CM_{U3}$, and the upper bit data is "3" when the voltage $V_{IN}$ of the input signal is higher than the voltage $V_{c3}$ (which are represented by decimal numbers).

For example, when upper bit data is "1", a lower limit voltage of a voltage range for lower bit conversion is a dividing point voltage between dividing resistors $R_{U1}$ and $R_{U2}$ and an upper limit voltage is a dividing point voltage between dividing resistors $R_{U5}$ and $R_{U6}$. More specifically, the voltage range for lower bit conversion is expanded from an upper half portion of a range in which the upper bit data is "0" to a lower half portion of a range in which the upper bit data is "2". For this reason, it is necessary to perform correction in three ways, that is, to add 1 to the upper bit data, to subtract 1 from the upper bit data and to perform neither addition nor subtraction.

FIGS. 17(a), 17(b) and 17(c) are diagrams for explaining a mechanism for requiring complicated correction for the upper bit data in the two-step parallel A/D converter according to the prior art in the same manner as in FIG. 16, and show the cases where the upper bit data are "0", "2" and "3", respectively. In the case where the upper bit data is "0" as shown in FIG. 17(a), it is not necessary to expand the lower bit conversion range beyond the low level reference voltage $V_{RB}$. In the case where the upper bit data is "3" as shown in FIG. 17(c), it is not necessary to expand the lower bit conversion range beyond the high level reference voltage $V_{RT}$.

FIG. 18 is a diagram showing a method for correcting upper bit data in the two-step parallel A/D converter according to the prior art, in which the lower bit data has 2 bits (3 bits including a bit for correction). As shown in FIG. 18, when the upper 2 bits of the lower bit data is "11", 1 is added to the upper bit data and the second bit is inverted into "0". On the other hand, when the upper 2 bits is "00", 1 is subtracted from the upper bit data and the second bit is inverted into "1".

As shown in FIG. 18, the upper bit data should be corrected by the lower bit data in three ways, that is, cases where 1 is added, 1 is subtracted, and neither addition nor subtraction is performed. Consequently, the converting circuit becomes complicated.

Furthermore, the two-step parallel A/D converter according to the prior art has had other problems.

FIG. 19 is a timing chart showing a timing of a clock signal for driving the two-step parallel A/D converter according to the prior art. As shown in FIG. 19, a clock signal CKU is generated in a first half of a period where the voltage $V_{IN}$ of the input signal is sampled and held, and a clock signal CKL is generated in a second half of the period. In addition, a clock signal CLK is generated. The clock signal CLK rises in the same timing as a clock signal CKU and has a duty ratio which is not smaller than that of the clock signal CKU. The upper comparator string 54 outputs a signal in a timing of the clock signal CKU, and the lower comparator string 57 outputs a signal in a timing of the clock signal CKL. The lower-upper buffer 60 latches corrected upper and lower bit data in a rise timing of the clock signal CLK.

In a timing shown in FIG. 19, it is necessary to convert an output signal of the lower comparator string 57 into the lower bit data by the lower encoder 58 and correct the upper bit data by the correcting circuit 59 while the upper comparator string 54 newly outputs a signal by the clock signal CKU in an (N+1) cycle after the lower comparator string 57 outputs a signal in response to the clock signal CKL in an N cycle. In other words, a time taken until a next clock signal CKU is generated after the clock signal CKL is generated should be longer than an operation margin of the correcting circuit 59. For this reason, it has been hard to increase a speed of A/D conversion.

The two-step parallel A/D converter according to the prior art has the following problems.

FIGS. 20(a), 20(b) and 20(c) are diagrams for explaining the problems of the two-step parallel A/D converter according to the prior art, and for explaining operation of the two-step parallel A/D converter according to the prior art shown in FIG. 14. FIG. 20(a) is a graph showing a change of a voltage $V_{IN}$ of an analog signal held by the sample-and-hold circuit 154 which is input to the first subtraction amplifier 171 and an upper limit voltage $V_{HH}$ of a reference voltage range to which the voltage $V_{IN}$ belongs, FIG. 20(b) is a graph showing a change of an input voltage $V_{LIN}$ of a lower bit converting section which is output from the first subtraction amplifier 171 and a high level reference voltage $V_{LH}$ and a low level reference voltage $V_{LL}$ of the lower bit converting section, and FIG. 20(c) is a graph showing an operating timing of the comparator for lower bit conversion 162.

In the two-step parallel A/D converter according to the prior art shown in FIG. 14, the voltage $V_{IN}$ of the analog signal and a lower limit voltage of the reference voltage range to which the voltage $V_{IN}$ of the analog signal belongs are amplified on the basis of the upper limit voltage $V_{HH}$ of the same reference voltage range by using the OP-amp type subtraction amplifiers 171 and 172, and the amplified voltages are used as the input voltage LIN and the low level reference voltage $V_{LL}$ of the lower bit converting section, respectively. By such a structure, voltage resolution required for the comparator for lower bit conversion 162 of the lower bit converting section is relieved. The upper limit voltage $V_{HH}$ of the reference voltage range to which the voltage $V_{IN}$ of the analog signal belongs is exactly used as the high level reference voltage $V_{HH}$ of the lower bit converting section.

With such a structure, therefore, when the voltage $V_{IN}$ of the analog signal is changed and the reference voltage range to which the voltage $V_{IN}$ of the analog signal belongs is changed in the upper bit converting section, the high level reference voltage $V_{LH}$ and the low level reference voltage $V_{LL}$ of the lower bit converting section are changed as shown in FIGS. 20(*a*) and 20(*b*). Accordingly, there is a problem that an A/D converting speed is restricted by transient delay until the high level reference voltage $V_{LH}$ and the low level reference voltage $V_{LL}$ are stabilized.

As shown in FIG. 20(*a*), the upper limit voltage $V_{HH}$ of the reference voltage range to which the voltage $V_{IN}$ of the analog signal belongs passes through the analog switch 157 working according to a result of operation in the comparator for upper bit conversion 156. Consequently, a timing in which the upper limit voltage $V_{HH}$ is determined is delayed for a timing in which the voltage $V_{IN}$ of the analog signal is sampled. As a result, periods (A) and (B) are generated in the first subtraction amplifier 171. In the period (A), a voltage to be amplified, that is, the voltage $V_{IN}$ of the analog signal and the voltage acting as a reference of amplification, that is, the upper limit voltage $V_{HH}$ of the reference voltage range to which the voltage $V_{IN}$ of the analog signal belongs are coincident with each other. In the period (B), the voltages are not coincident with each other.

As shown in FIG. 20(*b*), therefore, the input voltage $V_{LIN}$ of the lower bit converting section which is output from the first subtraction amplifier 171 exists between the high level reference voltage $V_{LH}$ and the low level reference voltage $V_{LL}$ of the lower bit converting section in the period (A), and a relative relationship between the voltage of the analog signal and the upper and lower limit voltages of the reference voltage range including the voltage of the analog signal is broken in the period (B). Consequently, the input voltage $V_{LIN}$ greatly gets out of a portion between the high level reference voltage $V_{LH}$ and the low level reference voltage $V_{LL}$ of the lower bit converting section. Also in the period (A), the input voltage $V_{LIN}$ of the lower bit converting section gets out of a portion between the high level reference voltage $V_{LH}$ and the low level reference voltage $V_{LL}$ due to a transient phenomenon generated during a transition from the period (B) to the period (A).

The high level reference voltage $V_{LH}$ and the low level reference voltage $V_{LL}$ of the lower bit converting section are also changed due to the transient phenomenon. Therefore, when a time taken from the transition to the period (A) to latch operation of the comparator for lower bit conversion 162 is short as shown in FIG. 20(*c*), for example, there is a possibility that great errors might be made on a digital value obtained by the A/D conversion. Accordingly, in the case where the two-step parallel A/D converter is caused to operate at a high speed, there is a problem that converting precision is lowered.

As shown in FIG. 14, furthermore, the first subtraction amplifier 171 for amplifying the voltage $V_{IN}$ of the analog signal is connected to the comparator for lower bit conversion 162 having a high input impedance, and the second subtraction amplifier 172 for amplifying the lower limit voltage is connected to the tap resistor for lower bit conversion 161. More specifically, the first subtraction amplifier 171 and the second subtraction amplifier 172 have different impedances loaded on their outputs. For this reason, the relative relationship between the voltage of the analog signal in the upper bit converting section and the reference voltage range to which the same voltage belongs is transmitted to the lower bit converting section with errors added thereto. Consequently, the converting precision is lowered.

SUMMARY OF THE INVENTION

It is an object of the present invention to provide a two-step parallel A/D converter capable of operating at a higher speed than in the prior art and easily correcting upper bit data.

It is another object of the present invention to provide a two-step parallel A/D converter in which operation can be performed with high precision at a high speed, voltage resolution required for a lower bit converting section is relieved, and a converting speed is not restricted and converting errors are not made during lower bit conversion.

More specifically, the present invention provides a two-step parallel A/D converter for performing A/D conversion of an input analog signal by upper bit conversion and lower bit conversion comprising means for expanding a voltage range for lower bit conversion on the basis of a median voltage of the voltage range irrespective of a voltage of the input analog signal. Consequently, a settling time of a reference voltage for lower bit conversion can be shortened. Consequently, the operation can be performed at a higher speed than in the prior art.

Preferably, the present invention provides a two-step parallel A/D converter for performing A/D conversion of an input analog signal by upper bit conversion and lower bit conversion, comprising: an upper bit converting section for dividing a portion between a predetermined high level reference voltage and a predetermined low level reference voltage into a plurality of reference voltage ranges, obtaining a reference voltage range to which a voltage of the analog signal belongs from the reference voltage ranges obtained by the division, generating and outputting bit data indicative of the obtained reference voltage range as upper bit data, and outputting an upper limit voltage, a lower limit voltage and a median voltage of a voltage range for lower bit conversion determined on the basis of the obtained reference voltage range; a first differential amplifier for inputting the analog signal and the median voltage of the voltage range for lower bit conversion which is output from the upper bit converting section and amplifying the voltage of the analog signal on the basis of the median voltage; a second differential amplifier having the same gain as that of the first differential amplifier, serving to input the upper limit voltage and the median voltage of the voltage range for lower bit conversion which is output from the upper bit converting section and to amplify the upper limit voltage on the basis of the median voltage; a third differential amplifier having the same gain as those of the first and second differential amplifiers, serving to input the lower limit voltage and the median voltage of the voltage range for lower bit conversion which is output from the upper bit converting section and to amplify the lower limit voltage on the basis of the median voltage; and a lower bit converting section for setting an output voltage of the second differential amplifier to a high level reference voltage for lower bit conversion, setting an output voltage of the third differential amplifier to a low level reference voltage for lower bit conversion, dividing a portion between the high level reference voltage and the lower level reference voltage into a plurality of reference voltage ranges, obtaining a reference voltage range to which the output voltage of the first differential amplifier belongs from the reference voltage ranges obtained by the division, and generating and outputting, as lower bit data, bit data indicative of the obtained reference voltage range.

Consequently, the high level reference voltage for lower bit conversion is obtained by amplifying the upper limit voltage of the voltage range for lower bit conversion to a high voltage side on the basis of the median voltage of the voltage range by the second differential amplifier. Furthermore, the low level reference voltage for lower bit conversion is obtained by amplifying the lower limit voltage of the voltage range for lower bit conversion to a low voltage side on the [−b]asis of the median voltage of the voltage range by the third differential amplifier. For this reason, the high level reference voltage and the low level reference voltage for lower bit conversion are not changed by the voltage of the input analog signal so that a settling time is shortened. In addition, the voltage of each reference voltage range is also stabilized. Consequently, resolution of lower bit conversion is also enhanced. Furthermore, the voltage of the input analog signal is amplified by the first differential amplifier with an amplification factor which is equal to those of the second and third differential amplifiers on the basis of the median voltage of the voltage range, and is then given to the lower bit converting section. Therefore, precision of lower bit conversion is not lowered.

Preferably, the upper bit converting section serves to output an upper limit voltage, a lower limit voltage and a median voltage of a predetermined voltage range and a median voltage of a voltage range for lower bit conversion in place of the upper limit voltage, the lower limit voltage and the median voltage of the voltage range for lower bit conversion, the second differential amplifier serves to input the upper limit voltage and the median voltage of the predetermined voltage range which are output from the upper bit converting section, and to amplify the upper limit voltage on the basis of the median voltage, and the third differential amplifier serves to input the lower limit voltage and the median voltage of the predetermined voltage range which are output from the upper bit converting section, and to amplify the lower limit voltage on the basis of the median voltage.

The present invention provides the two-step parallel A/D converter in which the upper and lower limit voltages of the reference voltage range in the upper bit converting section and the voltage of the input analog signal are amplified on the basis of the median voltage of the reference voltage range, and are then transmitted to the lower bit converting section.

Consequently, voltage resolution required for the comparator for lower bit conversion is relieved. In addition, the high level reference voltage and the low level reference voltage of the lower bit converting section are stabilized irrespective of a change of the analog signal. Consequently, a converting speed derived from a transient phenomenon is not restricted and the obtained lower bits have no error.

Preferably, the present invention provides a two-step parallel A/D converter for performing A/D conversion of an input analog signal by upper bit conversion and lower bit conversion, comprising: an upper bit converting section for dividing a portion between a predetermined high level reference voltage and a predetermined low level reference voltage into a plurality of reference voltage ranges, obtaining a reference voltage range to which a voltage of the analog signal belongs from the reference voltage ranges obtained by the division, and coding upper bits according to the obtained reference voltage ranges; a first differential amplifier for amplifying the voltage of the analog signal on the basis of a median voltage of the reference voltage range obtained by the upper bit converting section; a second differential amplifier having the same gain as that of the first differential amplifier and serving to amplify an upper limit voltage of the reference voltage range on the basis of a median voltage of the reference voltage range obtained by the upper bit converting section; a third differential amplifier having the same gain as those of the first and second differential amplifiers and serving to amplify a lower limit voltage of the reference voltage range on the basis of a median voltage of the reference voltage range obtained by the upper bit converting section; and a lower bit converting section for setting an output voltage of the second differential amplifier to a high level reference voltage for lower bit conversion, setting an output voltage of the third differential amplifier to a low level reference voltage for lower bit conversion, dividing a portion between the high level reference voltage and the low level reference voltage into a plurality of reference voltage ranges, obtaining a reference voltage range to which an output voltage of the first differential amplifier belongs from the reference voltage ranges obtained by the division, and coding lower bits in accordance with the obtained reference voltage ranges.

Consequently, the output voltage of the first differential amplifier, that is, the voltage of the input analog signal which is amplified on the basis of the median voltage of the reference voltage range obtained by the upper bit converting section is aimed at lower bit conversion. The output voltage of the second differential amplifier which is used as the high level reference voltage for lower bit conversion is obtained by amplifying the upper limit voltage of the reference voltage range on the basis of the median voltage of the reference voltage range. The output voltage of the third differential amplifier which is used as the low level reference voltage for lower bit conversion is obtained by amplifying the lower limit voltage of the reference voltage range on the basis of the median voltage of the reference voltage range. For this reason, with the lower bit converting section keeping a relative relationship between the upper and lower limit voltages of the reference voltage range obtained by the upper bit converting section and the voltage of the analog signal, each voltage difference is amplified. Consequently, voltage resolution required for the comparator for lower bit conversion is relieved. In addition, the high level reference voltage and low level reference voltage of the lower bit converting section are stabilized irrespective of a change of the analog signal. Therefore, a converting speed derived from a transient phenomenon is not restricted and the obtained lower bits have no error.

Preferably, the present invention provides a two-step parallel A/D converter for performing A/D conversion of an input analog signal by upper bit conversion and lower bit conversion, comprising: an upper bit converting section for dividing a portion between a predetermined high level reference voltage and a predetermined low level reference voltage into a plurality of reference voltage ranges, obtaining a reference voltage range to which a voltage of the analog signal belongs from the reference voltage ranges obtained by the division, and coding upper bits according to the obtained reference voltage range; a first differential amplifier for amplifying the voltage of the analog signal on the basis of a median voltage of the reference voltage range obtained by the upper bit converting section; a second differential amplifier having the same gain as that of the first differential amplifier and serving to amplify an upper limit voltage of the reference voltage range selected from the reference voltage ranges obtained by the division in the upper bit converting section on the basis of the median voltage of the reference voltage range; a third differential amplifier having the same gain as those of the first and second differential amplifiers and serving to amplify a lower limit voltage of the reference voltage range selected from the reference voltage ranges obtained by the division in the upper bit converting section on the basis of the median voltage of the reference voltage range; and a lower bit converting section for setting an output voltage of the second differential amplifier to a high level reference voltage for lower bit conversion, setting an output voltage of the third differential amplifier to a low level reference voltage for lower bit conversion, dividing a portion between the high level reference voltage and the low level reference voltage into a plurality of reference voltage ranges, obtaining a reference voltage range to which an output voltage of the first differential amplifier belongs from the reference voltage ranges obtained by the division, and coding lower bits in accordance with the obtained reference voltage range.

Consequently, the output voltage of the first differential amplifier, that is, the voltage of the analog signal which is amplified on the basis of the median voltage of the reference voltage range obtained by the upper bit converting section is aimed at lower bit conversion. The output voltage of the second differential amplifier which is used as the high level reference voltage for lower bit conversion is obtained by amplifying the upper limit voltage of the reference voltage range on the basis of the median voltage of one of the reference voltage ranges obtained by the division in the upper bit converting section. The output voltage of the third differential amplifier which is used as the low level reference voltage for lower bit conversion is obtained by amplifying the lower limit voltage of one of the reference voltage ranges obtained by the division in the upper bit converting section on the basis of the median voltage of the same reference voltage range. For this reason, the reference voltages of the second and third differential amplifiers and the voltage to be amplified are constant, and the high level reference voltage and low level reference voltage of the lower bit converting section are stabilized irrespective of a change of the analog signal. Therefore, a converting speed derived from a transient phenomenon is not restricted and the obtained lower bits have no error.

Preferably, the two-step parallel A/D converter further comprises switching means provided between the upper bit converting section and the first differential amplifier for switching, in accordance with a given control signal, a first state in which the median voltage of the reference voltage range obtained by the upper bit converting section is output as a reference voltage and the voltage of the analog signal is output as a voltage to be amplified to the first differential amplifier, and a second state in which the median voltage of the reference voltage range obtained by the upper bit converting section is output as the reference voltage and the voltage to be amplified to the first differential amplifier.

Consequently, when a timing of the voltage of the analog signal is not coincident with that of the median voltage of the reference voltage range determined by the upper bit converting section, the switching means is switched to the second state to output the median voltage of the reference voltage range obtained by the upper bit converting section as the reference voltage of the first differential amplifier and the voltage to be amplified. For this reason, even if the voltage of the analog signal is greatly different from the median voltage of the reference voltage range obtained by the upper bit converting section by a shift of the timing, the first differential amplifier outputs a predetermined voltage. Consequently, the output voltage of the first differential amplifier does not get out of a portion between the high level reference voltage and low level reference voltage of the lower bit converting section. Therefore, a converting speed derived from a transient phenomenon is not restricted and the obtained lower bits have no error.

Preferably, the two-step parallel A/D converter further comprises switching means provided between the upper bit converting section and the first differential amplifier for switching, in accordance with the given control signal, a first state in which the median voltage of the reference voltage range obtained by the upper bit converting section is output as a reference voltage to the first differential amplifier and the voltage of the analog signal is output as a voltage to be amplified to the first differential amplifier, and a second state in which the voltage of the analog signal is output as the reference voltage and the voltage to be amplified to the first differential amplifier.

Consequently, when a timing of the voltage of the analog signal is not coincident with that of the median voltage of the reference voltage range obtained by the upper bit converting section, the switching means is switched to the second state to output the voltage of the analog signal as the reference voltage of the first differential amplifier and the voltage to be amplified. For this reason, even if the voltage of the analog signal is greatly different from the median voltage of the reference voltage range obtained by the upper bit converting section by a shift of the timing, the first differential amplifier outputs a predetermined voltage. Consequently, the output voltage of the first differential amplifier does not get out of a portion between the high level reference voltage and low level reference voltage of the lower bit converting section. Therefore, a converting speed derived from a transient phenomenon is not restricted and the obtained lower bits have no error.

BRIEF DESCRIPTION OF THE DRAWINGS

FIGS. 20(a) to 20(c) are timing charts for explaining operation of the two-step parallel A/D converter according to the prior art.

DETAILED DESCRIPTION OF THE INVENTION (First Embodiment)

A two-step parallel A/D converter according to a first embodiment of the present invention will be described below with reference to the drawings.

Figure 1:
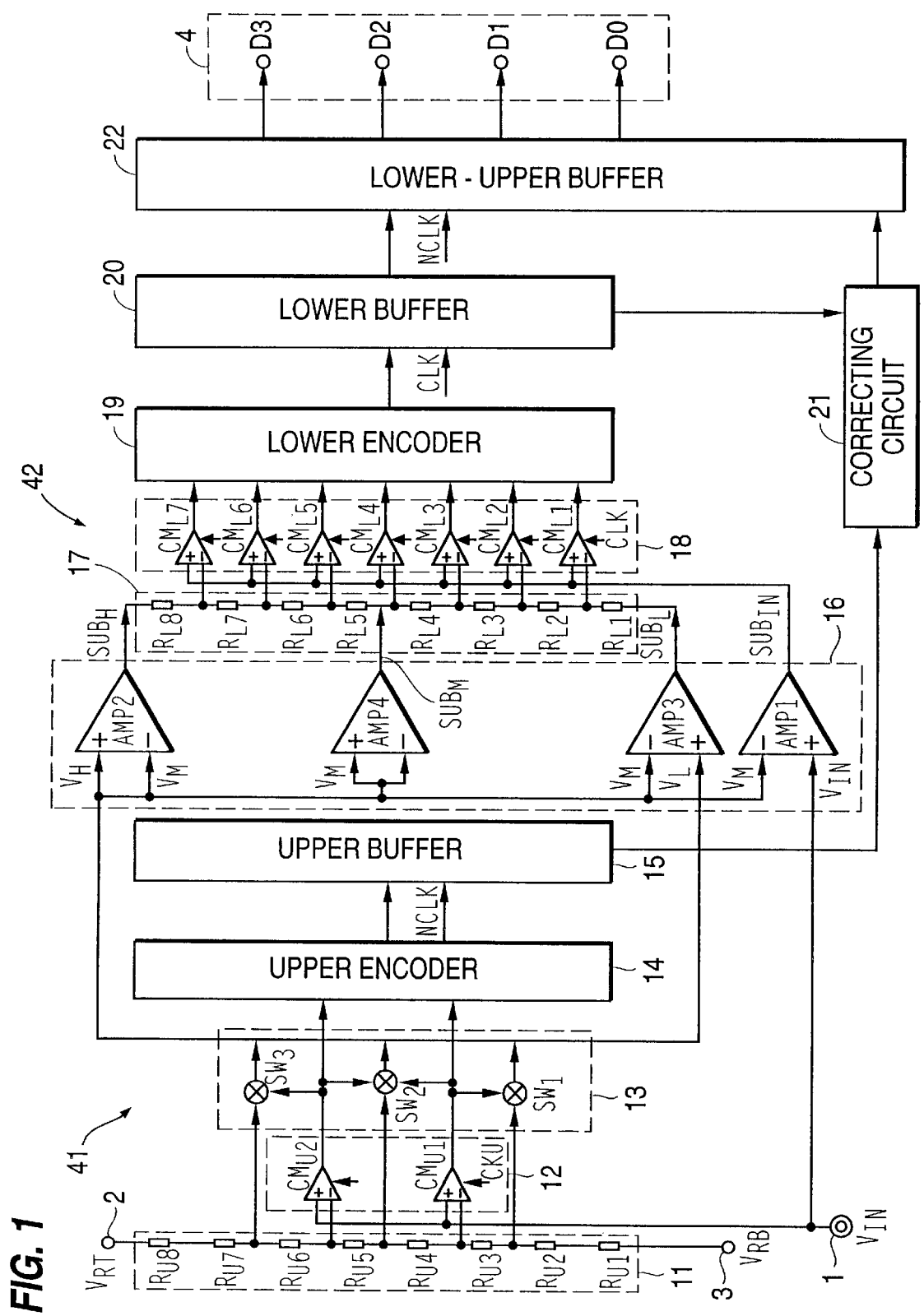
FIG. 1 is a diagram showing a circuit structure of a two-step parallel A/D converter according to a first embodiment of the present invention.

FIG. 1 is a circuit diagram showing a whole structure of a two-step parallel A/D converter according to the present embodiment. FIG. 1 shows a 4-bit A/D converter having upper 2 bits and lower 2 bits (lower 3 bits including a correction bit).

In FIG. 1, the reference numeral 1 denotes an input terminal to which a voltage $V_{IN}$ of a sampled and held input analog signal to be A/D converted is applied, the reference numeral 2 denotes a terminal to which a high level reference voltage $V_{RT}$ is applied, the reference numeral 3 denotes a terminal to which a low level reference voltage $V_{RB}$ is applied, and the reference numeral 4 denotes an output terminal of 4-bit digital signals $D_0$ to $D_3$ obtained as a result of the A/D conversion.

The reference numeral 11 denotes an upper resistor string including 8 (=$2^3$) resistors $R_{U1}$ to $R_{U8}$ that are connected in series and have the same resistance value, the reference numeral 12 denotes an upper comparator string having 2 (=2−2) comparators $CM_{U1}$ and $CM_{U2}$, the reference numeral 13 denotes a switch circuit including 3 (=$2^2$−1) switches $SW_1$ to $SW_3$, the reference numeral 14 denotes an upper encoder for encoding upper bit data, the reference numeral 15 denotes an upper buffer, the reference numeral 16 denotes a differential amplifier string including 4 differential amplifiers $AMP_1$ to $AMP_4$ having the same characteristics, the reference numeral 17 denotes a lower resistor string including 8 (=$2^3$) resistors $R_{L1}$ to $R_{L8}$ which are connected in series and have the same resistance values, the reference numeral 18 denotes a lower comparator string including 7 (=$2^3$−1) comparators $CM_{L1}$ to $CM_{L7}$, the reference numeral 19 denotes a lower encoder for encoding lower bit data, the reference numeral 20 denotes a lower buffer, the reference numeral 21 denotes a correcting circuit for correcting upper bit data, and the reference numeral 22 denotes a lower-upper buffer.

Figure 13:
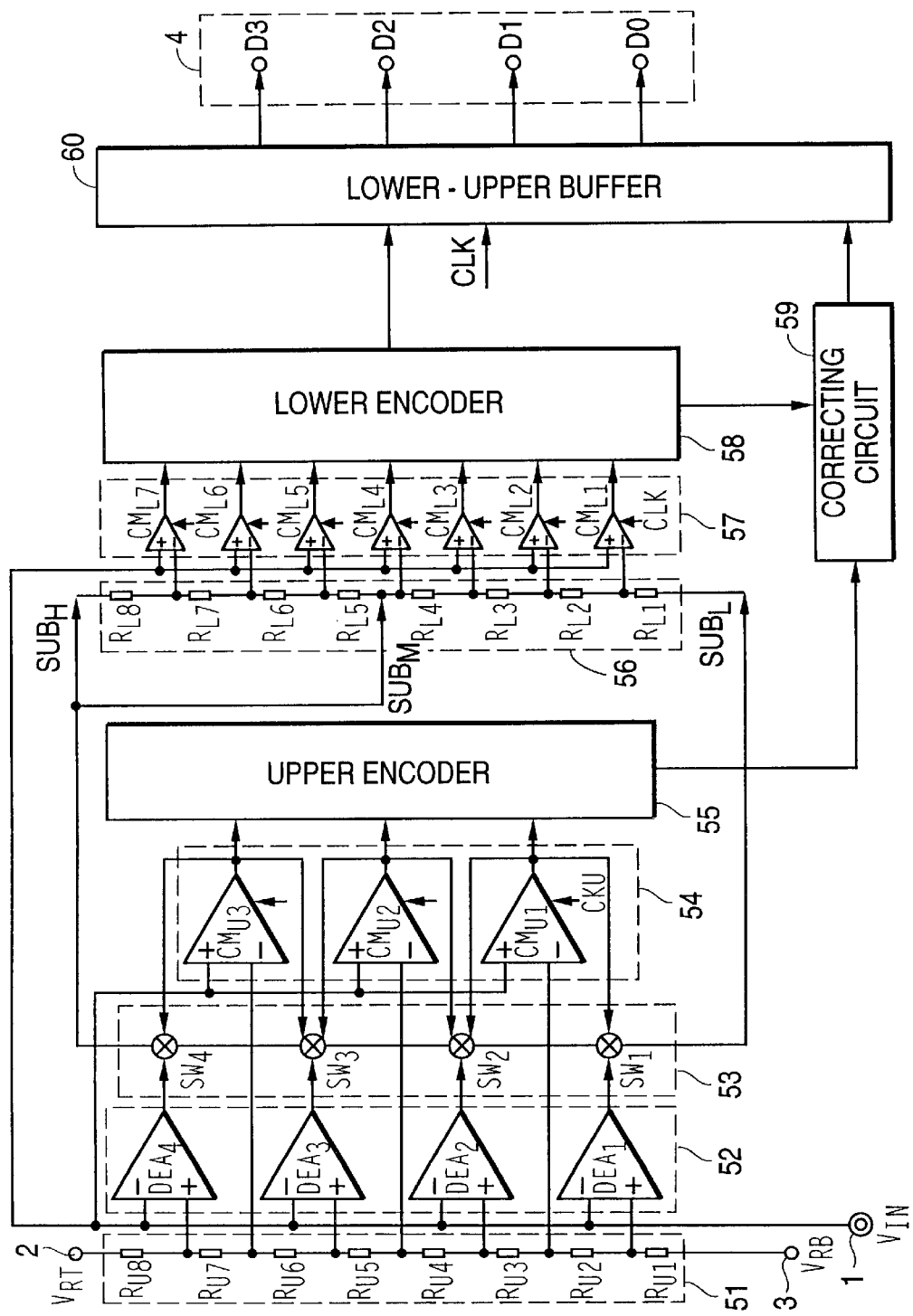
FIG. 13 is a diagram showing a circuit structure of a two-step parallel A/D converter according to the prior art.
Figure 14:
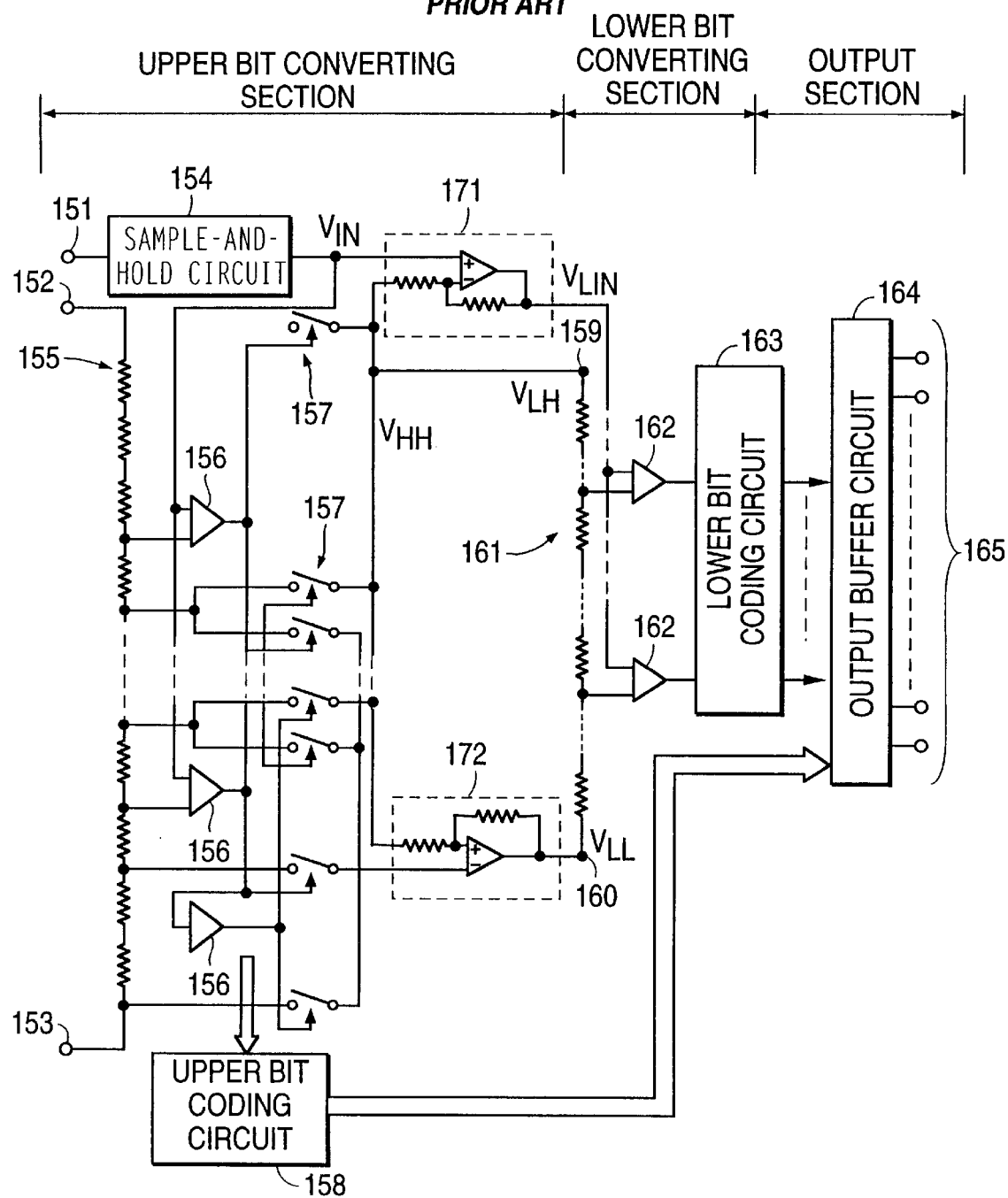
FIG. 14 is a circuit diagram showing a structure of another two-step parallel A/D converter according to the prior art.

As compared with FIG. 13, the upper resistor string 11 has the same structure as that of the upper resistor string 51, the lower resistor string 17 has the same structure as that of the lower resistor string 56, the lower comparator string 18 has the same structure as that of the lower comparator string 57, and the lower encoder 19 has the same structure as that of the lower encoder 58.

The upper resistor string 11, the upper comparator string 12, the switch circuit 13, the upper encoder 14 and the upper buffer 15 form an upper bit converting section 41. The lower resistor string 17, the lower comparator string 18, the lower encoder 19 and the lower buffer 20 form a lower bit converting section 42.

The input terminal 1 is connected to + side input terminals of comparators (hereinafter referred to as upper comparators) $CM_{U1}$ and $CM_{U2}$ forming the upper comparator string 12, and a + side input terminal of a first differential amplifier $AMP_1$ forming the differential amplifier string 16. The terminals 2 and 3 are connected to both ends of the upper resistor string 11.

The upper resistor string 11 has 7 (=$2^3$−1) dividing points between resistors. The even-numbered dividing points divide a portion between the high level reference voltage $V_{RT}$ applied to the terminal 2 and the low level reference voltage $V_B$ applied to the terminal 3 into a plurality of reference voltage ranges, and are respectively connected to the switches $SW_1$ to $SW_3$ forming the switch circuit 13. The odd-numbered dividing points (excluding the dividing points on both ends) are connected to − side input terminals of the upper comparators $CM_{U1}$ and and $CM_{U2}$, respectively.

The upper comparator string 12 causes the upper comparators $CM_{U1}$ and $CM_{U2}$ to compare the voltage $V_{IN}$ of the input signal applied to the input terminal 1 with a voltage of the dividing point of the upper resistor string 11 in a timing of a clock signal CKU, and outputs a signal indicative of the reference voltage range to which the voltage $V_{IN}$ of the input signal belongs. An output signal of the upper comparator string 12 is input to the upper encoder 14. The upper encoder 14 converts the output signal of the upper comparator string 12 into upper bit data to be output. The upper buffer 15 latches the upper bit data in a rise timing of a clock signal NCLK, and outputs the latched data to the correcting circuit 21. The output signal of the upper comparator string 12 is also input to the switch circuit 13.

The switch circuit 13 controls the switches $SW_1$ to $SW_3$ in response to the output signal of the upper comparator string 12, and outputs, to the differential amplifier string 16, an upper limit voltage $V_H$, a median voltage $V_M$ and a lower limit voltage $V_L$ of a voltage range for lower bit conversion (hereinafter referred to as a lower conversion range). For example, when an output signal of the upper comparator $CM_{U1}$ has the "H" level and that of the upper comparator $CM_{U2}$ has the "L" level, voltages of the dividing points between the resistors $R_{U6}$ and $R_{U7}$, between the resistors $R_{U4}$ and $R_{U5}$, and between the resistors $R_{U2}$ and $R_{U3}$ are set to $V_H$, $V_M$ and $V_L$, respectively.

The differential amplifier string 16 inputs the upper limit voltage $V_H$, the median voltage $V_M$ and the lower limit voltage $V_L$ of the lower conversion range and the voltage $V_{IN}$ of the input signal, and for the lower bit converting section 42 outputs a high level reference voltage $SUB_H$, a median reference voltage $SUB_M$ and a low level reference voltage $SUB_L$, and a voltage $SUB_{IN}$ to be lower bit A/D converted. The second differential amplifier $AMP_2$ inputs the voltages $V_H$ and $V_M$ to + and − side input terminals respectively, and amplifies the voltage $V_H$ on the basis of the voltage $V_M$ and outputs the amplified voltage as the voltage $SUB_H$. The third differential amplifier $AMP_3$ inputs the voltages $V_L$ and $V_M$ to + and − side input terminals respectively, and amplifies the voltage $V_L$ on the basis of the voltage $V_M$ and outputs the amplified voltage as the voltage $SUB_L$. The fourth differential amplifier $AMP_4$ inputs the voltages $V_M$ to + and − side input terminals, and outputs the voltage $SUB_M$. The first differential amplifier $AMP_1$ inputs the voltages $V_M$ and $V_{IN}$ to the − and + side input terminals respectively, and amplifies the voltage $V_{IN}$ on the basis of the voltage $V_M$ and outputs the amplified voltage as the voltage $SUB_{IN}$. An output terminal of the first differential amplifier $AMP_1$ is connected to + side input terminals of lower comparators $CM_{L1}$ to $CM_{L7}$ forming the lower comparator string 18.

In the lower resistor string 17, the output voltage $SUB_H$ of the second differential amplifier $AMP_2$ is applied as a high level reference voltage, the output voltage $SUB_L$ of the third differential amplifier $AMP_3$ is applied as a low level reference voltage, and the output voltage $SUB_M$ of the fourth differential amplifier $AMP_4$ is applied as a median reference voltage to an intermediate dividing point (between the resistors $R_{L4}$ and $R_{L5}$). The lower resistor string 17 has 7 (=$2^3$−1) dividing points between the resistors, thereby dividing a portion between the high level reference voltage $SUB_H$ and the low level reference voltage $SUB_L$ into a plurality of reference voltage ranges. The dividing points of the lower resistor string 17 are connected to − side input terminals of the lower comparators $CM_{L1}$ to $CM_{L7}$, respectively.

The lower comparator string 18 causes the lower comparators $CM_{L1}$ to $CM_{L7}$ to compare the voltage $SUB_{IN}$ with a voltage of each dividing point of the lower resistor string 17 in a timing of a clock signal CKL, and outputs a signal indicative of the reference voltage range to which the voltage $SUB_{IN}$ belongs. An output signal of the lower comparator string 18 is input to the lower encoder 19. The lower encoder 19 converts the output signal of the lower comparator string 18 into lower bit data to be output. The lower buffer 20 latches the lower bit data in a rise timing of a clock signal CLK and outputs the latched data to the lower-upper buffer 22, and outputs a part of the lower bit data to the correcting circuit 21.

The correcting circuit 21 corrects the input upper bit data by using a part of the lower bit data, and outputs the corrected data to the lower-upper buffer 22. The lower-upper buffer 22 adds and outputs the corrected upper and lower bit data to the output terminal 4 in the rise timing of a clock signal NCLK.

The most characteristic of the two-step parallel A/D converter shown in FIG. 1 is that the differential amplifier string 16 is provided between the upper bit converting section 41 and the lower bit converting section 42. Operation of the differential amplifier string 16 will be described below.

Figure 2:
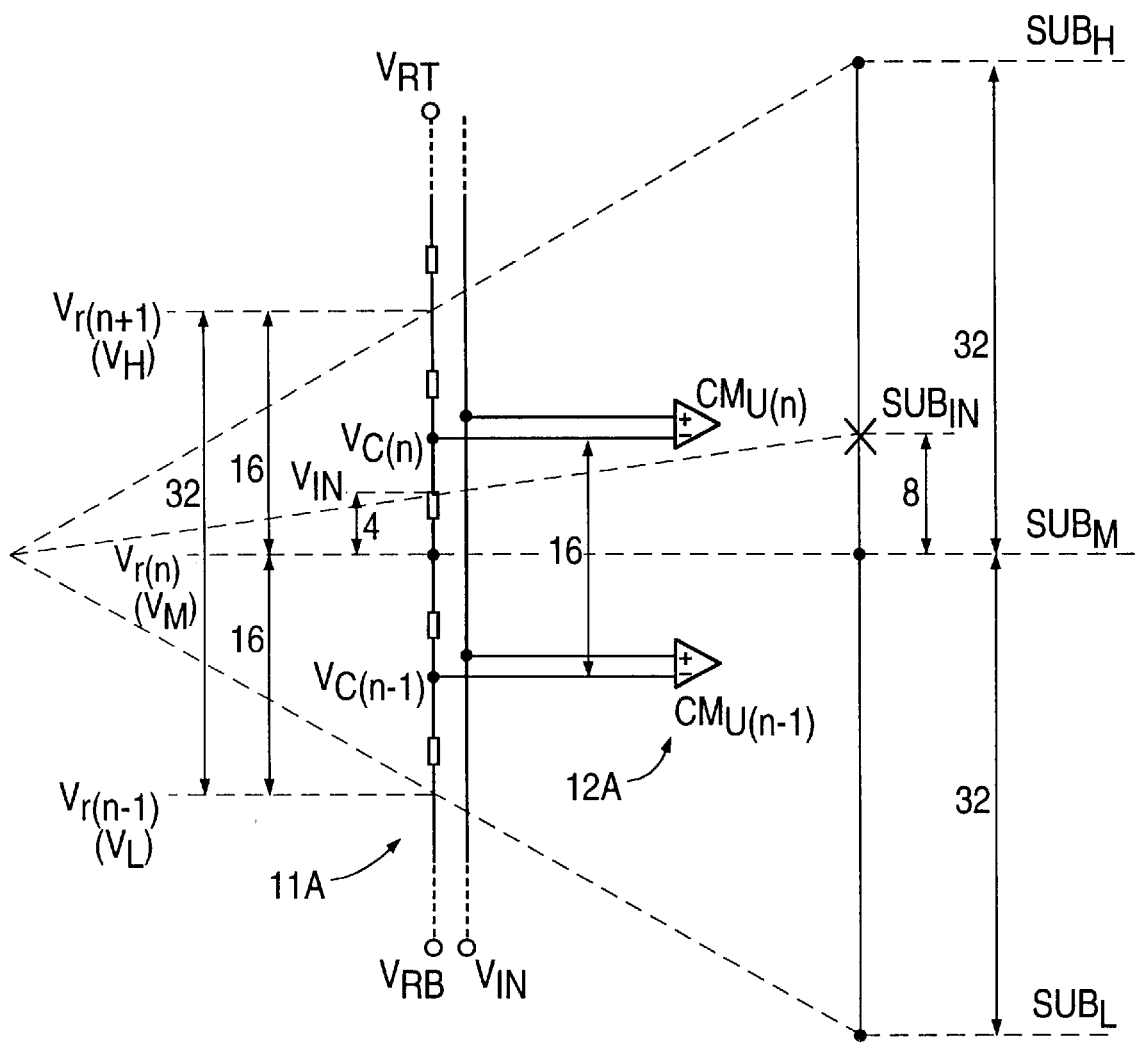
FIG. 2 is a diagram showing a method for expanding a lower conversion range in the two-step parallel A/D converter according to the first embodiment of the present invention.

FIG. 2 is a diagram for explaining the operation of the differential amplifier string 16, and showing a relationship between the upper limit voltage $V_H$, the median voltage $V_M$ and the lower limit voltage $V_L$ of the lower conversion range and the input voltage $V_{IN}$, and the output voltages $SUB_H$, $SUB_M$, $SUB_L$ and $SUB_{IN}$ of the first to fourth differential amplifiers $AMP_1$ to $AMP_4$.

In FIG. 2, the reference numeral 11A denotes an upper resistor string, the reference numeral 12A denotes an upper comparator string, and only portions necessary for explanation are shown. In the upper resistor string 11A, a voltage of an odd-numbered dividing point is set to $V_{c(n)}$ and that of an even-numbered dividing point is set to $V_{r(n)}$. A reference voltage range ($V_{c(n)}$−$V_{c(n-1)}$) for upper bit conversion has 16 steps, and a reference voltage range ($V_{r(n+1)}$−$V_{r(n-1)}$)) for lower bit conversion has 32 steps. For simplicity, the first to fourth differential amplifiers $AMP_1$ to $AMP_4$ have double gains.

The upper comparator $CMU_{(n)}$ compares the voltage $V_{c(n)}$ with the voltage $V_{IN}$ of the input signal. When the voltage $V_{IN}$ of the input signal is between the voltage $V_{c(n-1)}$ and the voltage $V_{c(n)}$, the voltage $V_{r(n+1)}$ is selected as the upper limit voltage $V_H$ of the lower conversion range, the voltage $V_{r(n)}$ is selected as the median voltage $V_M$ of the lower conversion range, and the voltage $V_{r(n-1)}$ is selected as the lower limit voltage $V_L$ of the lower conversion range.

The second differential amplifier $AMP_2$ amplifies the voltage $V_H$ on the basis of the voltage $V_H$ irrespective of the voltage $V_{IN}$, and outputs the amplified voltage as the voltage $SUB_H$. The third differential amplifier $AMP_3$ amplifies the voltage $V_L$ on the basis of the voltage $V_M$ irrespective of the voltage $V_{IN}$, and outputs the amplified voltage as the voltage $SUB_L$. The fourth differential amplifier $AMP_4$ outputs the voltage $V_M$ as the voltage $SUB_M$ irrespective of the voltage $V_{IN}$. As a result, the voltage $SUB_H$ is generated on the higher level side than the voltage $SUB_M$ by 32 (=16×2) steps, and the voltage $SUB_L$ is generated on the lower level side than the voltage $SUB_M$ by 32 (=16×2) steps.

The first differential amplifier $AMP_1$ amplifies the voltage $V_{IN}$ of the input signal on the basis of the voltage $V_M$, and outputs the amplified voltage as the voltage $SUB_{IN}$. If the voltage $V_{IN}$ is on the higher level side than the voltage $V_{r(n)}$ (=$V_M$) by 4 steps, the voltage $SUB_{IN}$ is generated on the higher level side than the voltage $SUB_M$ by 8 (=4×2) steps. In other words, a relative relationship between the voltages $V_H$ and $V_L$ and the voltage $V_{IN}$ is also kept for the lower bit conversion.

According to the present embodiment, thus, the reference voltages $SUB_H$, $SUB_M$ and $SUB_L$ of the lower bit converting section 42 are not changed with the voltage $V_{IN}$ of the input signal but are stabilized.

It is not necessary to select the reference voltages $V_H$, $V_M$ and $V_L$ of the lower conversion range in response to the output signal of the upper comparator string 12. For example, it is sufficient that three optionally continuous even-numbered dividing point voltages of the upper resistor string 11 are input as the voltages $V_H$, $V_M$ and $V_L$ to the second to fourth differential amplifiers $AMP_2$ to $AMP_4$ and that the median voltage $V_M$ of the lower conversion range determined by the output signal of the upper comparator string 12 is input to only the first differential amplifier $AMP_1$. Even so, the relationship between the output voltage $SUB_{IN}$ of the first differential amplifier $AMP_1$ and the reference voltages $SUB_H$ and $SUB_L$ is shown in FIG. 2. In this case, it is sufficient that the switch circuit 13 outputs only the voltage $V_M$ determined by the upper comparator string 12 to the differential amplifier string 16.

Figure 15:
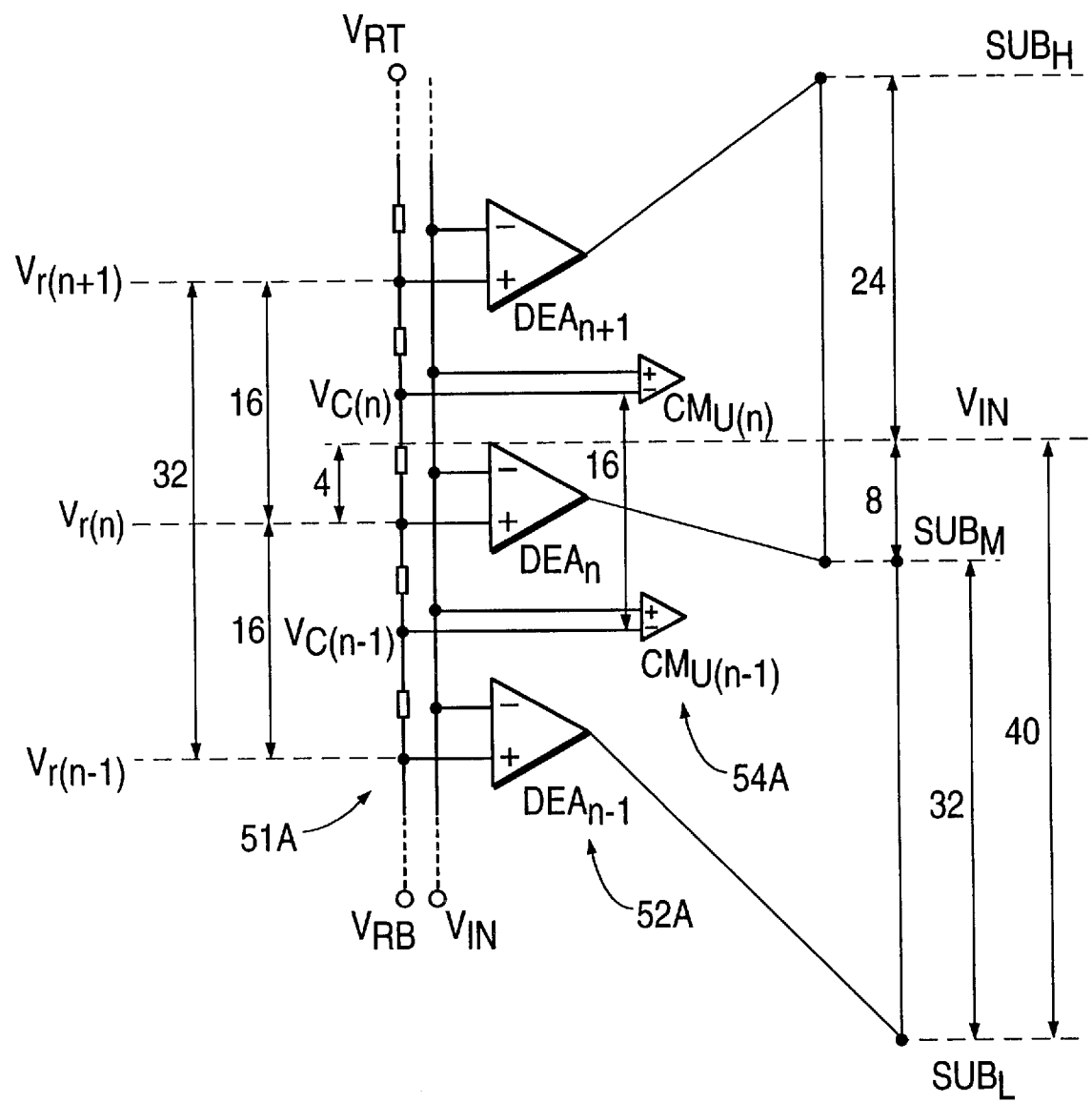
FIG. 15 is a diagram showing a method for expanding a lower conversion range in the two-step parallel A/D converter according to the prior art.
Figure 16:
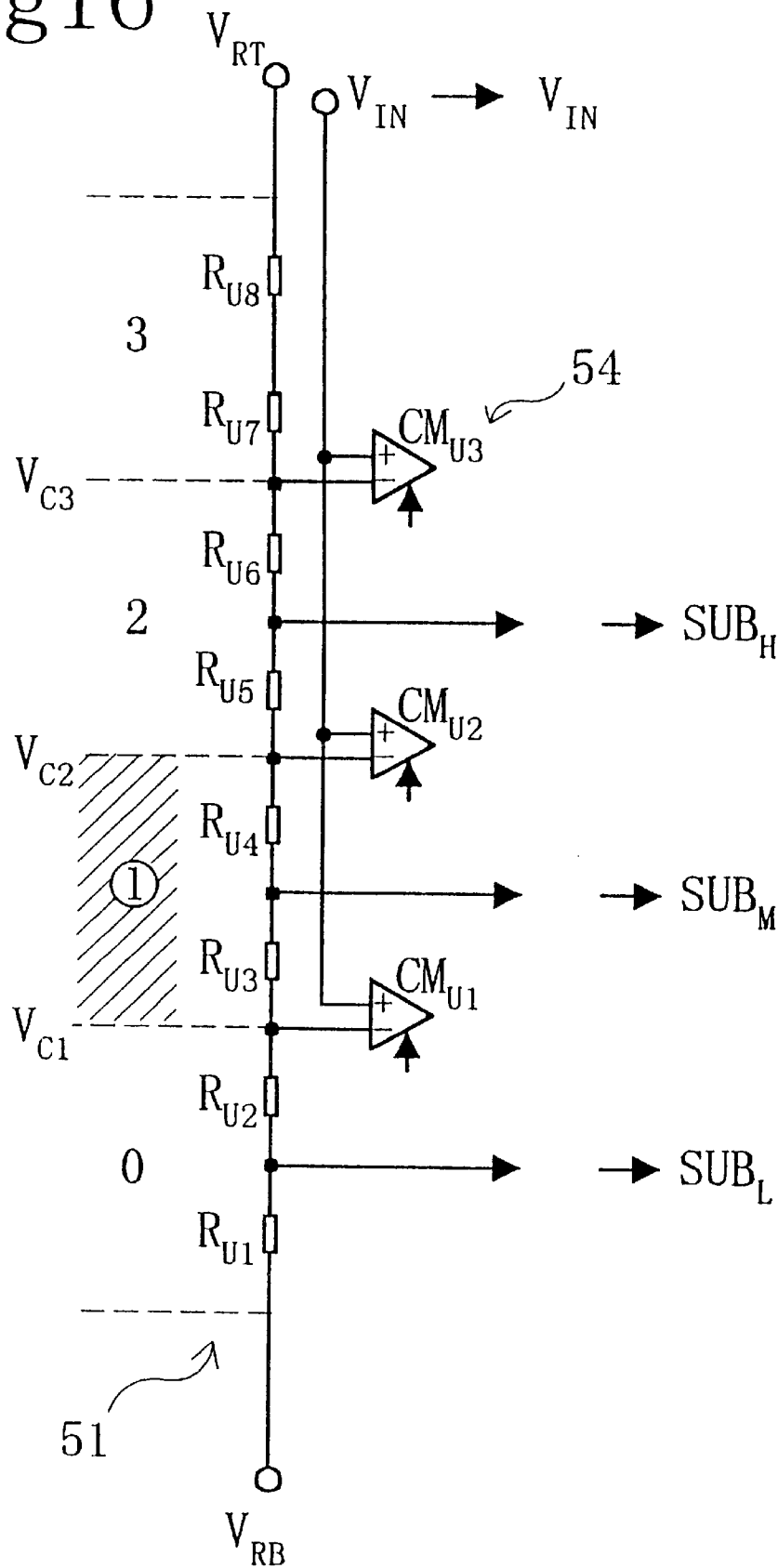
FIG. 16 is a diagram for explaining the reason why correction of upper bit data is complicated in the two-step parallel A/D converter according to the prior art.
Figure 17A:
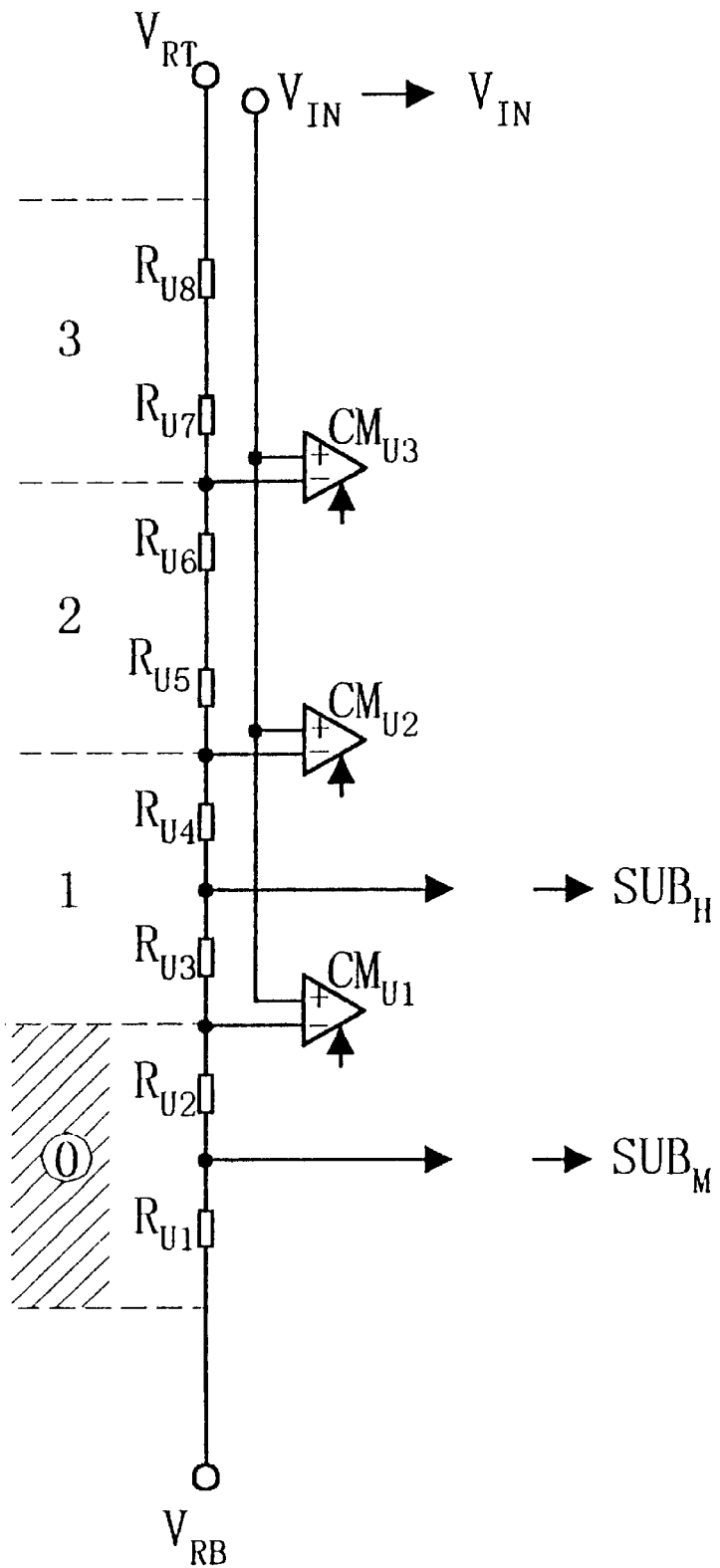
FIGS. 17(a) to 17(c) are diagrams for explaining the reason why the correction of the upper bit data is complicated in the two-step parallel A/D converter according to the prior art.
Figure 17B:
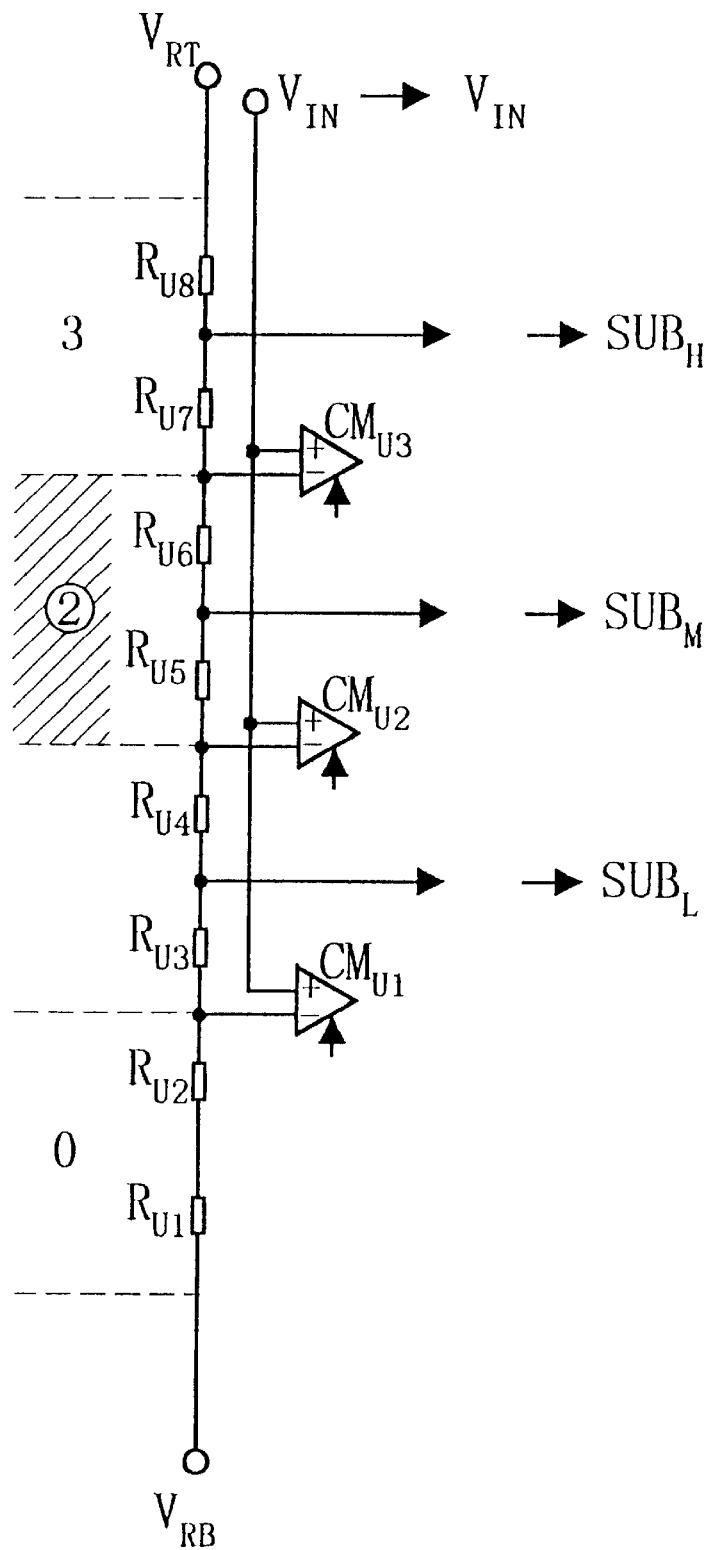
Figure 17C:
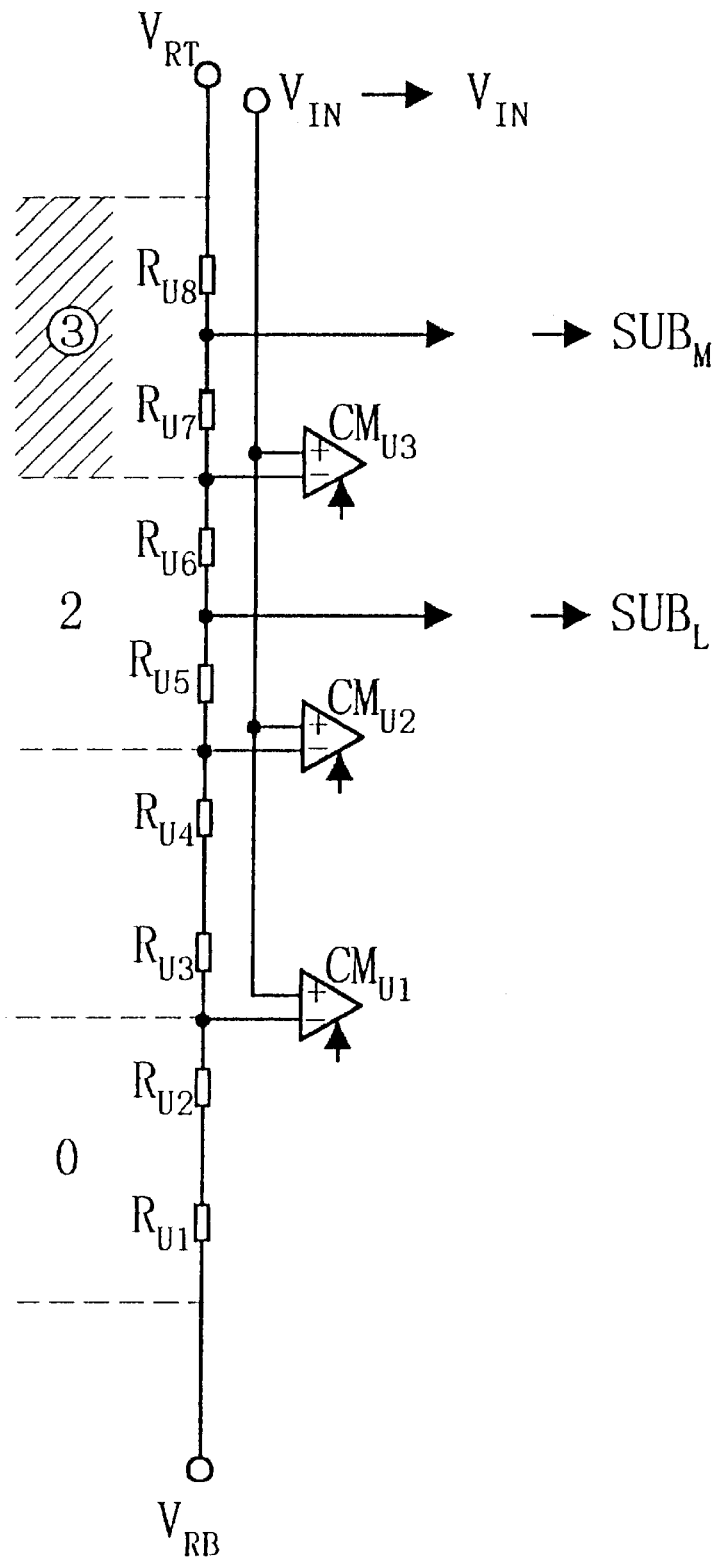

As described above, the present embodiment greatly differs from the prior art in that the reference voltages $SUB_H$, $SUB_M$ and $SUB_L$ of the lower bit converting section 42 are fixed to constant voltages and do not fluctuate for each conversion cycle, which is apparent from a comparison between FIGS. 2 and 15.

Operation of the two-step parallel A/D converter shown in FIG. 1 will be described below.

Figure 3A:
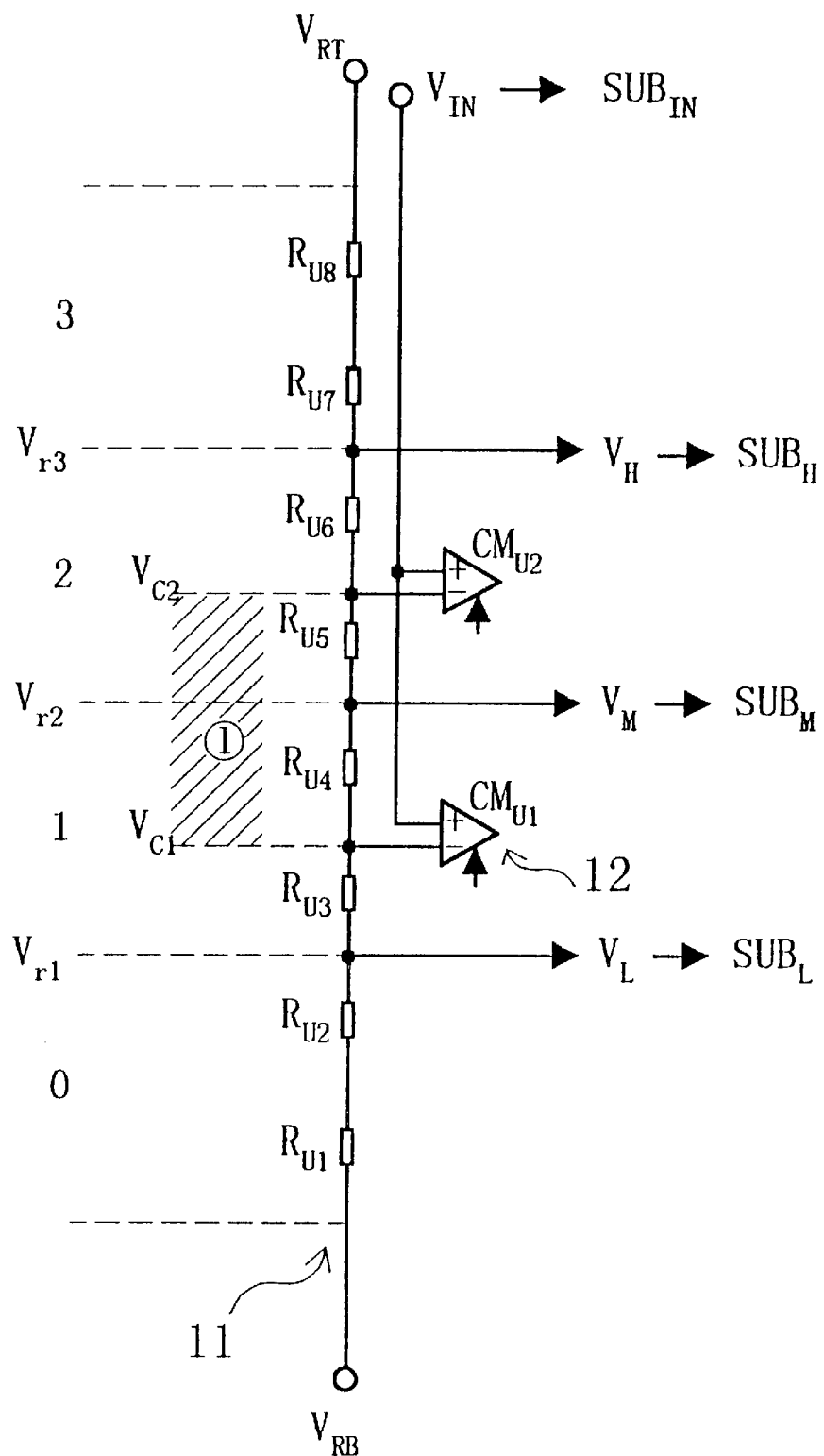
FIGS. 3(a) to 3(c) are diagrams showing a mechanism for easily correcting upper bit data in the two-step parallel A/D converter according to the first embodiment of the present invention.
Figure 3B:
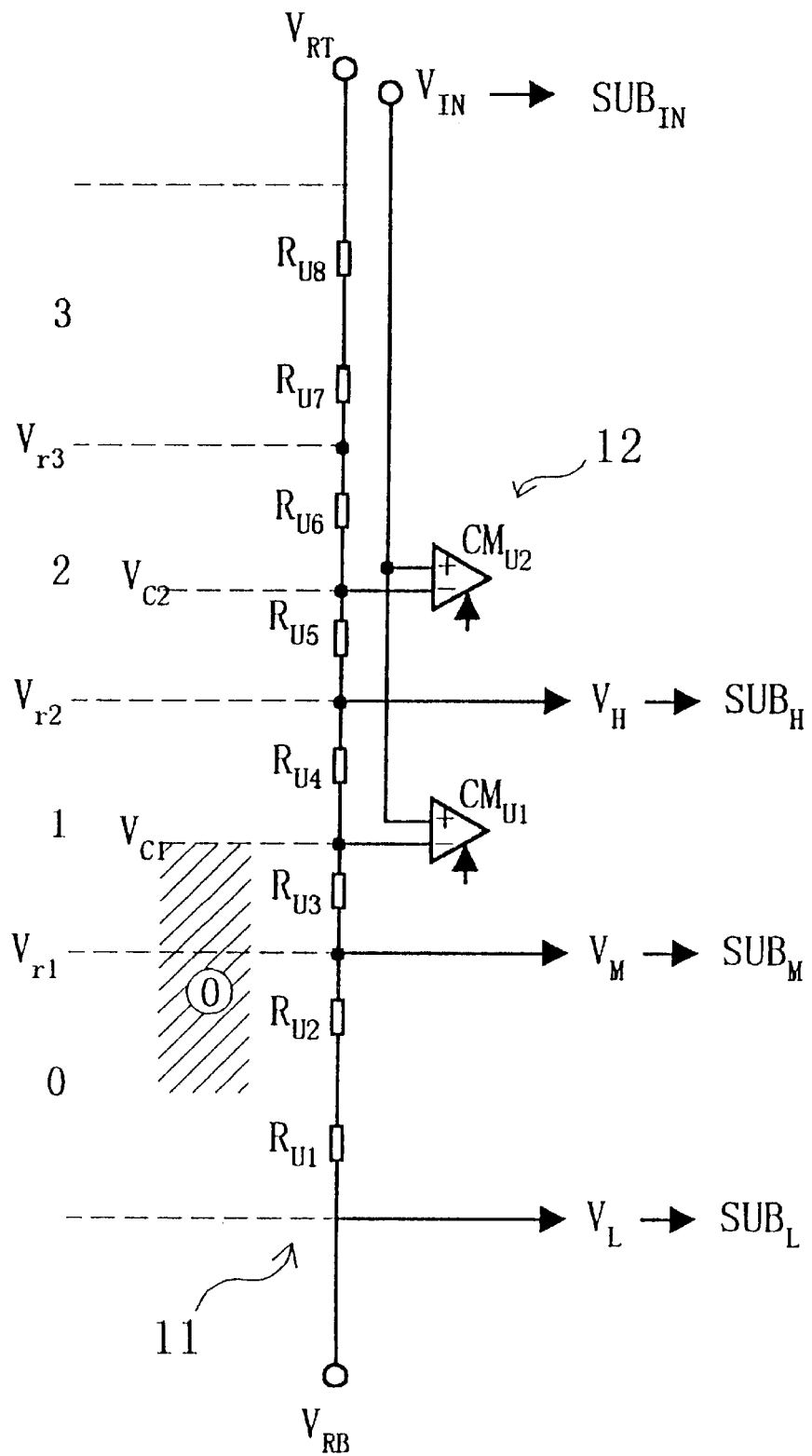
Figure 3C:
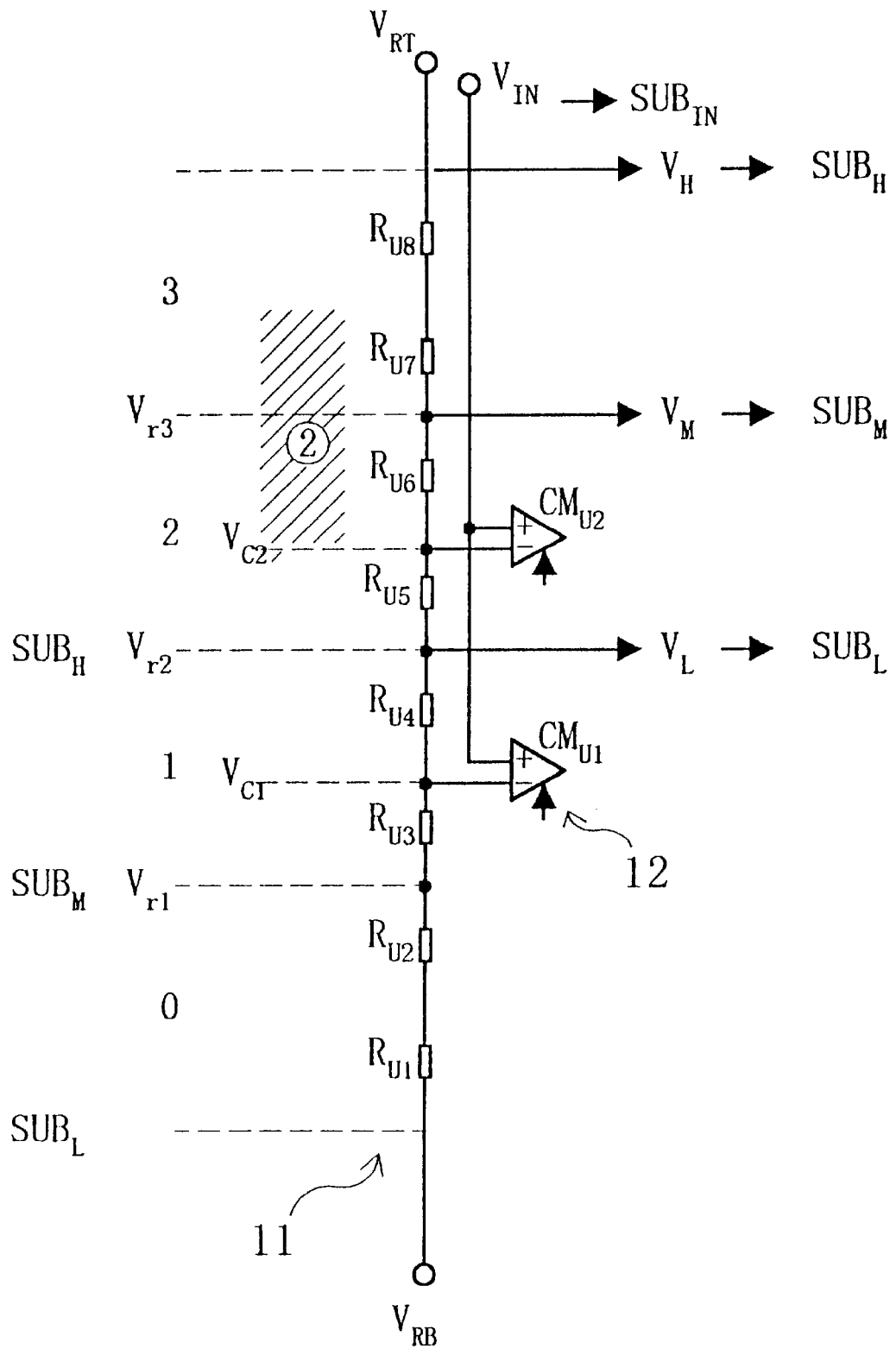

First of all, operation of the upper bit converting section 41 will be described below. FIGS. 3(a) to 3(c) are diagrams for explaining the operation of the upper bit converting section 41, in which the reference numeral 11 denotes an upper resistor string and the reference numeral 12 denotes an upper comparator string. FIG. 3(a) shows a case where the voltage $V_{IN}$ of the input signal is between the reference voltage $V_{c1}$ of the upper comparator $CM_{U1}$ and the reference voltage $V_{c2}$ of the upper comparator $CM_{U2}$ (a portion shown by an oblique line). FIG. 3(b) shows a case where the voltage $V_{IN}$ of the input signal is lower than the reference voltage $V_{c1}$ of the upper comparator $CM_{U1}$. FIG. 3(c) shows a case where the voltage $V_{IN}$ of the input signal is higher than the reference voltage $V_{c2}$ of the upper comparator $CM_{U2}$.

As shown in FIGS. 3(a) to 3(c), the upper resistor string 11 divides a portion between a high level reference voltage $V_{RT}$ and a low level reference voltage $V_{RB}$ into 4 reference voltage ranges, and have 4 kinds of upper bit data (2 bits). The upper bit data is set to "0" when the voltage $V_{IN}$ of the input signal is between the low level reference voltage $V_{RB}$ and the voltage $V_{r1}$, is set to "1" when the voltage $V_{IN}$ of the input signal is between the voltages $V_{r1}$ and $V_{r2}$, is set to "2" when the voltage $V_{IN}$ of the input signal is between the voltages $V_{r2}$ and $V_{r3}$, and is set to "3" when the voltage $V_{IN}$ of the input signal is between the voltage $V_{r3}$ and the high level reference voltage $V_{RT}$ (which is represented by decimal numbers).

On the other hand, only two upper comparators are connected. Therefore, 3 kinds of upper bit data are obtained by the upper bit converting section 41 (which are enclosed by a circle in FIGS. 3(a) to 3(c)). In FIG. 3(a), the output signal of the upper comparator $CM_{U1}$ is set to the "H" level, the output signal of the upper comparator $CM_{U2}$ is set to the "L" level, and the upper bit data obtained by the upper encoder 14 is set to "1". In FIG. 3(b), the output signals of the upper comparators $CM_{U1}$ and $CM_{U2}$ are set to the "L" level, and the upper bit data obtained by the upper encoder 14 is set to "0". In FIG. 3(c), the output signals of the upper comparators $CM_{U1}$ and $CM_{U2}$ are set to the "H" level, and the upper bit data obtained by the upper encoder 14 is set to "2".

In general, if the number of resistors forming the upper resistor string 11 is $2^n$, a portion between the high level reference voltage $V_{RT}$ and the low level reference voltage $V_{RB}$ is divided into $2^{n-1}$ reference voltage ranges, the number of comparators forming the upper comparator string 12 is set to $(2^{n-1}-2)$, the $(2^{n-1}-1)$ kinds of upper bit data are obtained by the upper bit converting section 41. For this reason, the upper bit data should be corrected, which will be described below.

In FIG. 3(a), the voltages $V_{r3}$, $V_{r2}$ and $V_{r1}$ are output, to the differential amplifier string 16, as the upper limit voltage $V_H$, the median voltage $V_M$ and the lower limit voltage $V_L$ of the lower conversion range. In FIG. 3(b), similarly, the voltages $V_{r2}$, $V_{r1}$ and $V_{RB}$ are output, to the differential amplifier string 16, as the upper limit voltage $V_H$, the median voltage $V_M$ and the lower limit voltage $V_L$ of the lower conversion range. In FIG. 3(c), the voltages $V_{RT}$, $V_{r3}$ and $V_{r2}$ are output, to the differential amplifier string 16, as the upper limit voltage $V_H$, the median voltage $V_M$ and the lower limit voltage $V_L$ of the lower conversion range.

However, as described above, it is not necessary to select the voltages $V_H$, $V_M$ and $V_L$ of the lower conversion range according to the output signal of the upper comparator string 12. It is sufficient that three optionally continuous even-numbered dividing point voltages of the upper resistor string are input as the voltages $V_H$, $V_M$ and $V_L$ and that the median voltage value $V_M$ of the lower conversion range determined by the output signal of the upper comparator string 12 is input to only the first differential amplifier $AMP_1$.

As described above, the differential amplifier string 16 converts the upper limit voltage $V_H$, the median voltage $V_M$ and the lower limit voltage $V_L$ of the lower conversion range into the high level reference voltage $SUB_H$, the median reference voltage $SUB_M$ and the low level reference voltage $SUB_L$ for lower bit conversion, and converts the voltage $V_{IN}$ of the input signal into the voltage $SUB_{IN}$ to be lower bit A/D converted.

Operation of the lower bit converting section 42 will be described below. The lower resistor string 17 divides a portion between the high level reference voltage $SUB_H$ for lower bit conversion and the low level reference voltage $SUB_L$ for lower bit conversion into 8 reference voltage ranges, and there are 8 kinds of lower bit data (3 bits). In order to reduce a dividing error of the lower resistor string 17, furthermore, the median reference voltage $SUB_M$ is applied to a central dividing point (between the resistors $R_{L4}$ and $R_{L5}$).

The lower comparators $CM_{L1}$ to $CM_{L7}$ forming the lower comparator string 18 compare the voltages of the dividing points of the lower resistor string 17 with the voltage $SUB_{IN}$ for lower bit A/D conversion, and outputs a signal indicative of a result of comparison. The lower encoder 19 converts an output signal of the lower comparator string 18 into 3-bit lower bit data. MSB of the lower bit data is used for correcting the lower bit data.

Operation of the correcting circuit 21 will be described below. As shown in FIGS. 3(a) to 3(c), true upper bit data is not always coincident with the upper bit data obtained by the upper bit converting section 41. In FIG. 3(a), for example, "1" is obtained as the upper bit data. However, the cases where the true upper bit data is "2" and "1" have possibilities of 50%, respectively. At this time, the lower limit voltage $V_L$ of the lower conversion range is the voltage $V_{r1}$, and the upper limit voltage $V_H$ of the lower conversion range is the voltage $V_{r3}$. Therefore, the lower conversion range is coincident with a range in which the true upper data is "1" or "2". For this reason, MSB of the lower bit data is set to "1" when the input voltage $V_{IN}$ is higher than the voltage $V_M$, and is set to "0" when the input voltage $V_{IN}$ is lower than the voltage $V_M$. Accordingly, the upper bit data can easily be corrected by using the MSB of the lower bit data.

Figure 4:
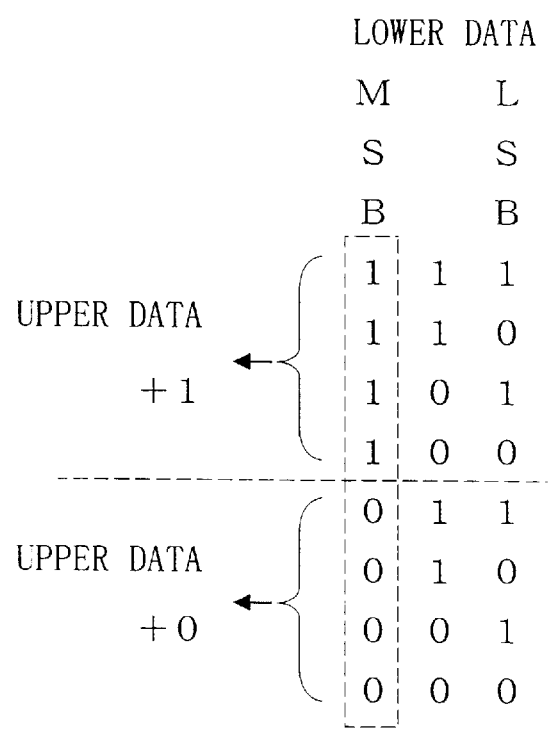
FIG. 4 is a chart showing a method for correcting the upper bit data in the two-step parallel A/D converter according to the first embodiment of the present invention.

FIG. 4 shows a method for correcting the upper bit data by the correcting circuit 21. As shown in FIG. 4, the correcting circuit 21 adds "1" to the upper bit data when the MSB of the converted lower bit data is "1" (in a binary or gray code), and does not correct the upper bit data when the MSB of the lower bit data is "0".

Figure 18:
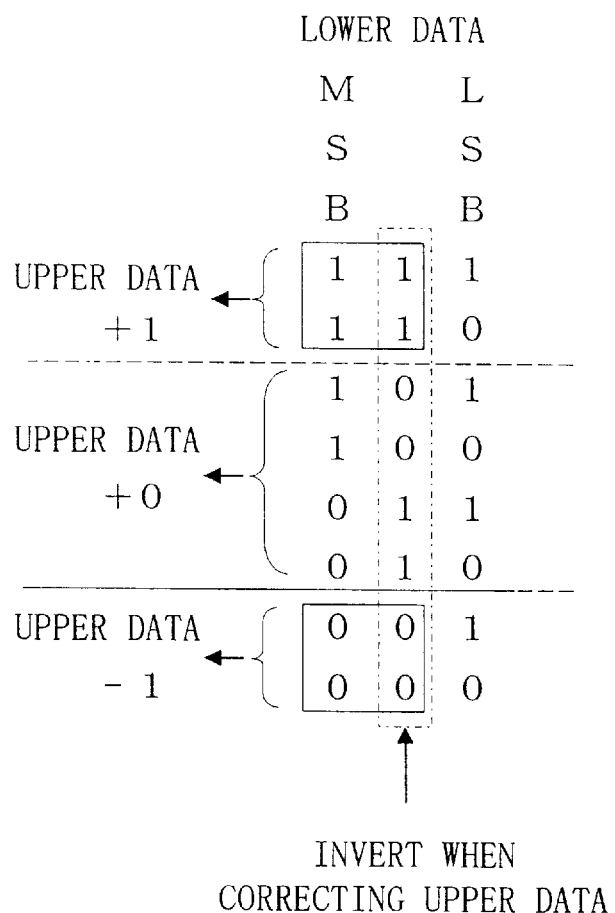
FIG. 18 is a chart showing a method for correcting the upper bit data in the two-step parallel A/D converter according to the prior art.
Figure 19:
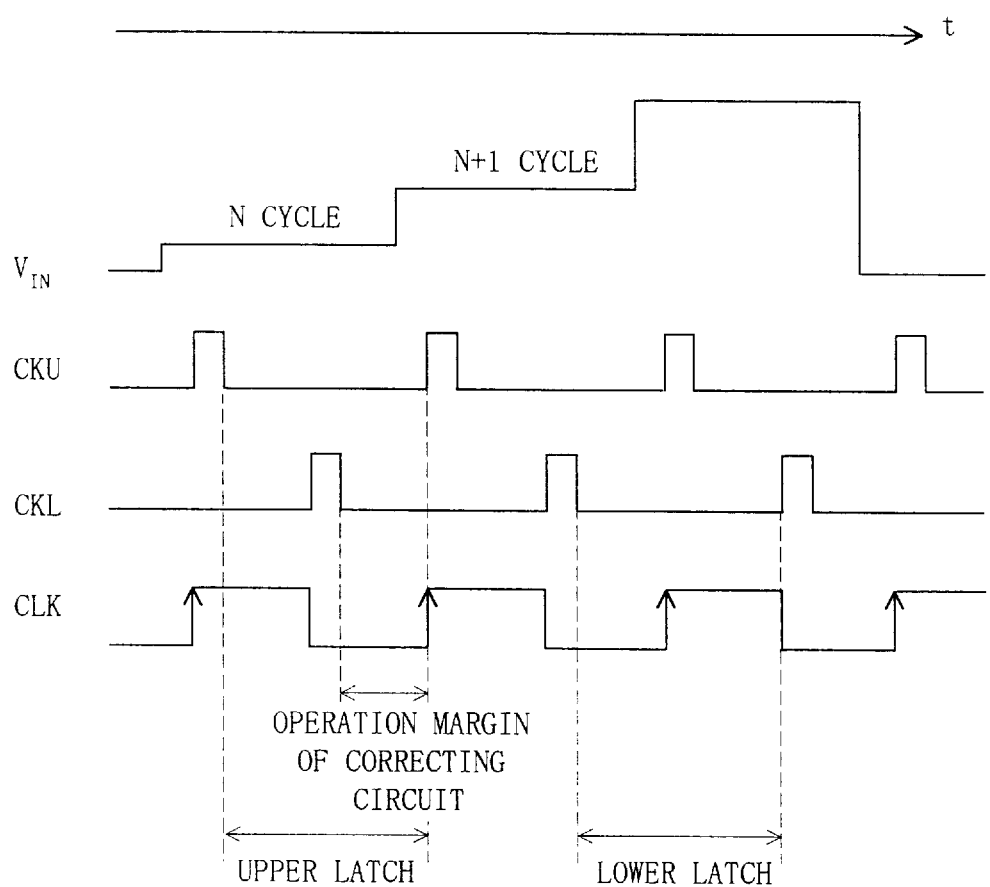
FIG. 19 is a timing chart showing a timing of a signal for driving the two-step parallel A/D converter according to the prior art.

Accordingly, the present invention greatly differs from the prior art in that "1" is added or not depending on the MSB of the lower bit data, which is apparent from a comparison between FIGS. 4 and 18. Consequently, a structure of the correcting circuit can be simplified more than in the prior art.

Figure 5:
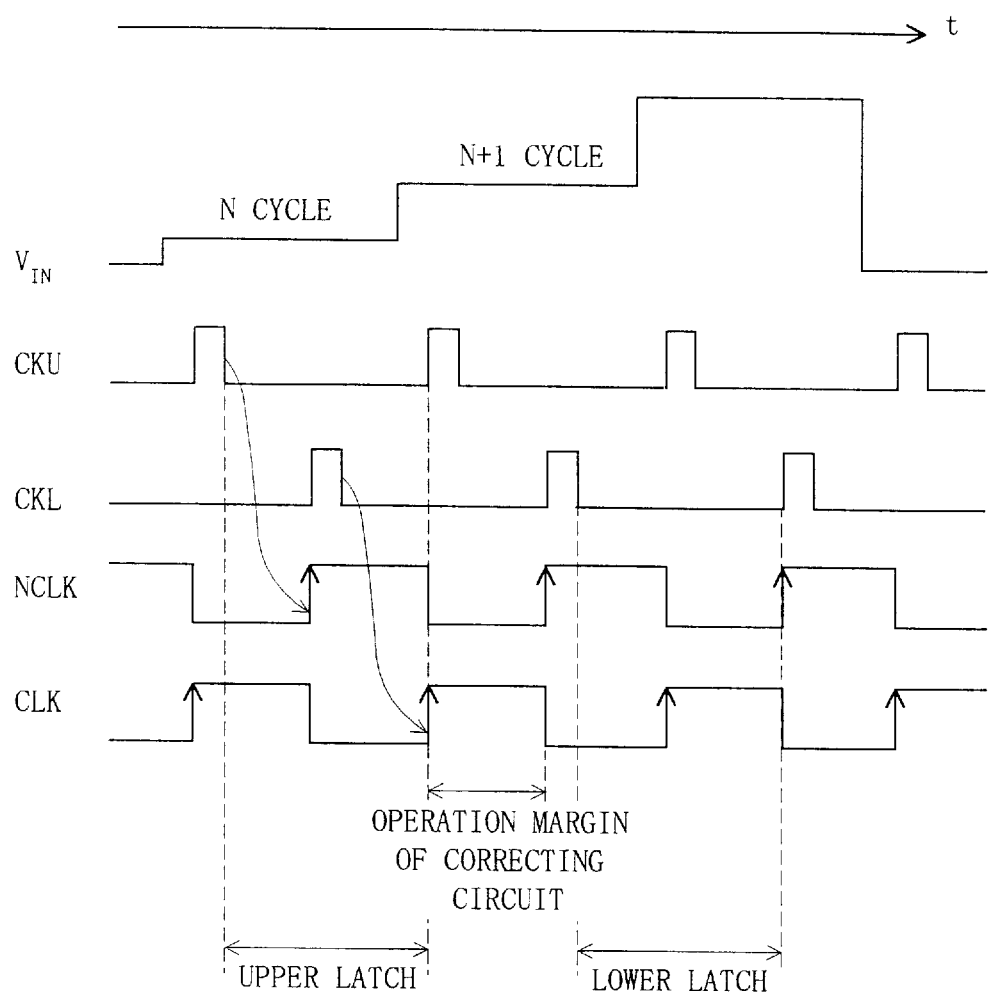
FIG. 5 is a timing chart showing a timing of a signal for driving the two-step parallel A/D converter according to the first embodiment of the present invention.

FIG. 5 is a timing chart showing a timing of a signal for driving the two-step parallel A/D converter in FIG. 1. As shown in FIG. 5, a clock signal CKU for causing the upper comparator string 12 to operate is generated in the first half of a period in which the input voltage $V_{IN}$ is sampled and held, and a clock signal CKL for causing the lower comparator string 18 to operate is generated in the second half of the period. A clock signal NCLK for causing the upper buffer 15 and the lower-upper buffer 22 to latch has a leading edge (or a trailing edge) in almost the same timing as the clock signal CKL, and a clock signal CLK for causing the lower buffer 20 to latch has a leading edge (or a trailing edge) in almost the same timing as a clock signal CKU.

The two-step parallel A/D converter shown in FIG. 1 operates in the following manner in the timing of the signal shown in FIG. 5.

First of all, an output signal of the upper comparator string 12 defined by the clock signal CKU in an N cycle is converted into upper bit data by the upper encoder 14, and the upper bit data is latched to the upper buffer 15 in response to a rise of the clock signal NCLK. Then, an output signal of the lower comparator string 18 defined by the clock signal CLK in the N cycle is converted into lower bit data by the lower encoder 19, and the lower bit data is latched to the lower buffer 20 in response to a rise of the clock signal CLK.

The upper bit data latched to the upper buffer 15 is corrected as described above according to the MSB of the lower bit data latched to the lower buffer 20. The corrected upper and lower bit data are latched to the lower-upper buffer 22 in response to a rise of the clock signal NCLK in an (N+1) cycle together, and are output to the output terminal 4.

Accordingly, an operation margin of the correcting circuit 21 is taken while the lower buffer 20 latches the lower bit data in response to the rise of the clock signal CLK and the lower-upper buffer 22 then latches the corrected upper and lower bit data in response to the rise of the clock signal NCLK.

While the 4-bit A/D converter having upper 2 bits and lower 2 bits has been described as an example in the present embodiment, the present invention is not restricted thereto but can be implemented by an (N+M)-bit A/D converter (N and M are natural numbers) having upper N bits and lower M bits. In this case, it is sufficient that the upper resistor string 11 is formed by $2^{N+1}$ resistors, the upper comparator string 12 is formed by ($2^N-2$) comparators, the switch circuit 13 is formed by ($2^N-1$) switches, the lower resistor string 17 is formed by $2^{M+1}$ resistors, and the lower comparator string 18 is formed by ($2^{M+1}-1$) comparators.

(Second Embodiment)

A second embodiment of the present invention will be described below with reference to the drawings.

Figure 6:
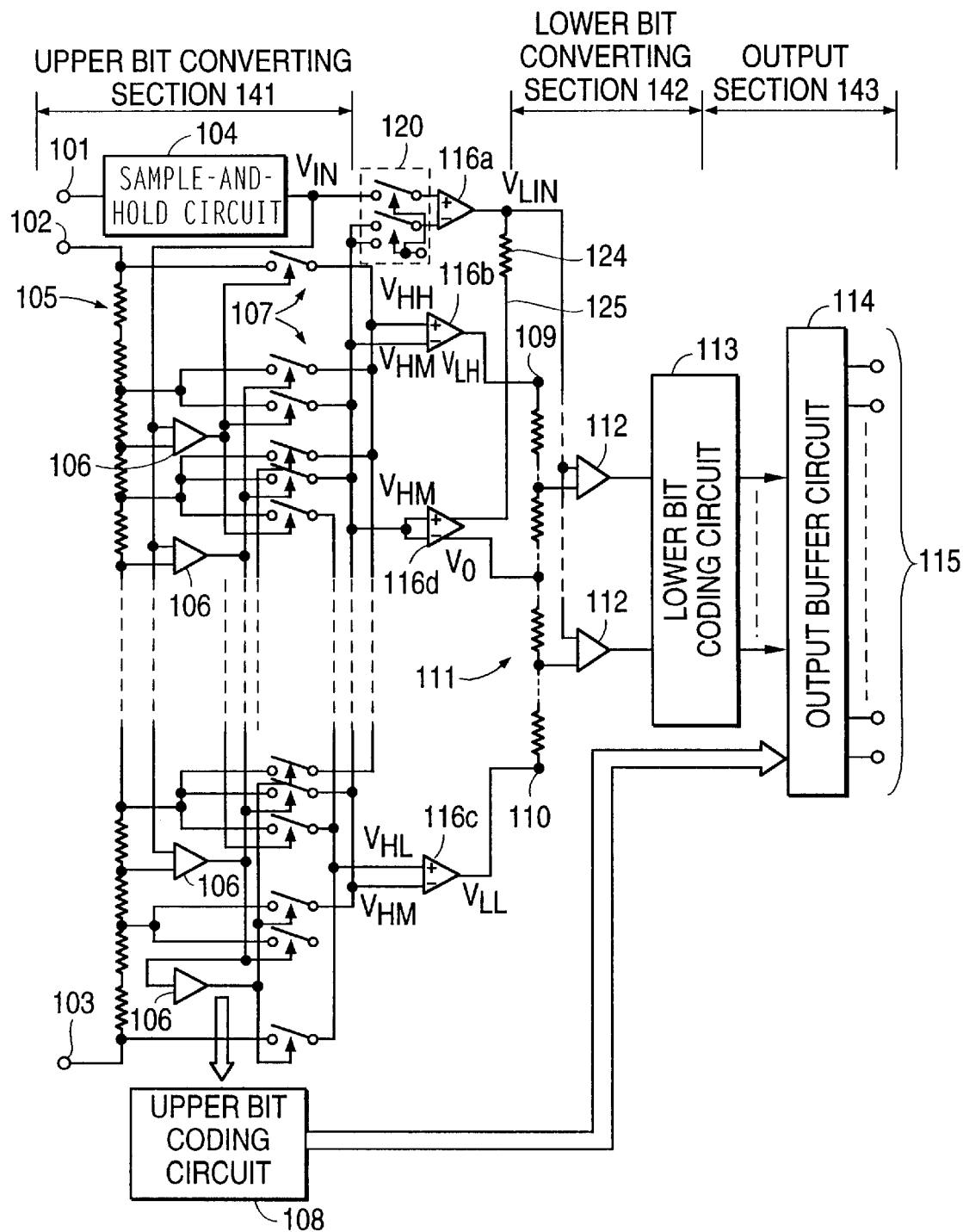
FIG. 6 is a circuit diagram showing a structure of a two-step parallel A/D converter according to a second embodiment of the present invention.

FIG. 6 is a circuit diagram showing a whole structure of a two-step parallel A/D converter according to the second embodiment of the present invention. In FIG. 6, the reference numeral 101 denotes an analog signal input terminal to which an analog signal for A/D conversion is input, the reference numeral 102 denotes a high level reference voltage terminal for upper bit conversion, the reference numeral 103 denotes a low level reference voltage terminal for upper bit conversion, the reference numeral 104 denotes a sample-and-hold circuit for sampling and holding the analog signal input to the analog signal input terminal 101, the reference numeral 105 denotes a tap resistor for upper bit conversion which serves to divide a voltage between the high level reference voltage terminal for upper bit conversion 102 and the low level reference voltage terminal for upper bit conversion 103, the reference numeral 106 denotes a comparator for upper bit conversion, the reference numeral 107 denotes an analog switch, the reference numeral 108 denotes an upper bit coding circuit, the reference numeral 109 denotes a high level reference voltage terminal for lower bit conversion, the reference numeral 110 denotes a low level reference voltage terminal for lower bit conversion, the reference numeral 111 denotes a tap resistor for lower bit conversion which serves to divides a voltage between the high level reference voltage terminal for lower bit conversion 109 and the low level reference voltage terminal for lower bit conversion 110, the reference numeral 112 denotes a comparator for lower bit conversion, the reference numeral 113 denotes a lower bit coding circuit, the reference numeral 114 denotes an output buffer circuit, and the reference numeral 115 denotes a digital signal output terminal.

An upper bit converting section 141 is formed by the tap resistor for upper bit conversion 105, the comparator for upper bit conversion 106, the analog switch 107, and the upper bit coding circuit 108. A lower bit converting section 142 is formed by the tap resistor for lower bit conversion 111, the comparator for lower bit conversion 112, and the lower bit coding circuit 113. An output section 143 is formed by the output buffer circuit 114.

The reference numeral 116a denotes a first differential amplifier having a gain fixed, the reference numeral 116b denotes a second differential amplifier having a gain fixed, the reference numeral 116c denotes a third differential amplifier having a gain fixed, the reference numeral 116d denotes a fourth differential amplifier having a gain fixed, the reference numeral 120 denotes switch means, and the reference numeral 124 denotes a resistor.

Operation of the two-step parallel A/D converter shown in FIG. 6 will be described below.

An analog signal input to the analog signal input terminal 101 is sampled by the sample-and-hold circuit 104, and is kept at a constant voltage from an A/D conversion period of upper bits to that of lower bits.

In the upper bit converting section 141, the comparator for upper bit conversion 106 compares a voltage $V_{IN}$ of the analog signal held by the sample-and-hold circuit 104 with each reference voltage signal obtained by dividing the voltage between the high level reference voltage terminal for upper bit conversion 102 and the low level reference voltage terminal for upper bit conversion 103 by the tap resistor for upper bit conversion 105 so that a reference voltage range to which the voltage $V_{IN}$ of the analog signal belongs is obtained. In accordance with the obtained reference voltage range, the upper bit coding circuit 108 codes upper bits of a digital signal indicative of the analog signal. The analog switch 107 is connected to a dividing point of each reference voltage range.

In order to obtain more subdivided digital values, the second differential amplifier 116b amplifies an upper limit voltage $V_{HH}$ of the reference voltage range to which the voltage $V_{IN}$ of the analog signal belongs on the basis of a median voltage $V_{HM}$ of the same reference voltage range, and outputs the amplified voltage as a high level reference voltage $V_{LH}$ for lower bit conversion to the high level reference voltage terminal for lower bit conversion 109, and the third differential amplifier 116c amplifies a lower limit voltage $V_{HL}$ of the reference voltage range to which the voltage $V_{IN}$ of the analog signal belongs on the basis of a median voltage $V_{HM}$ of the same reference voltage range, and outputs the amplified voltage as a low level reference voltage $V_{LL}$ for lower bit conversion to the low level reference voltage terminal for lower bit conversion 110.

Figure 7:
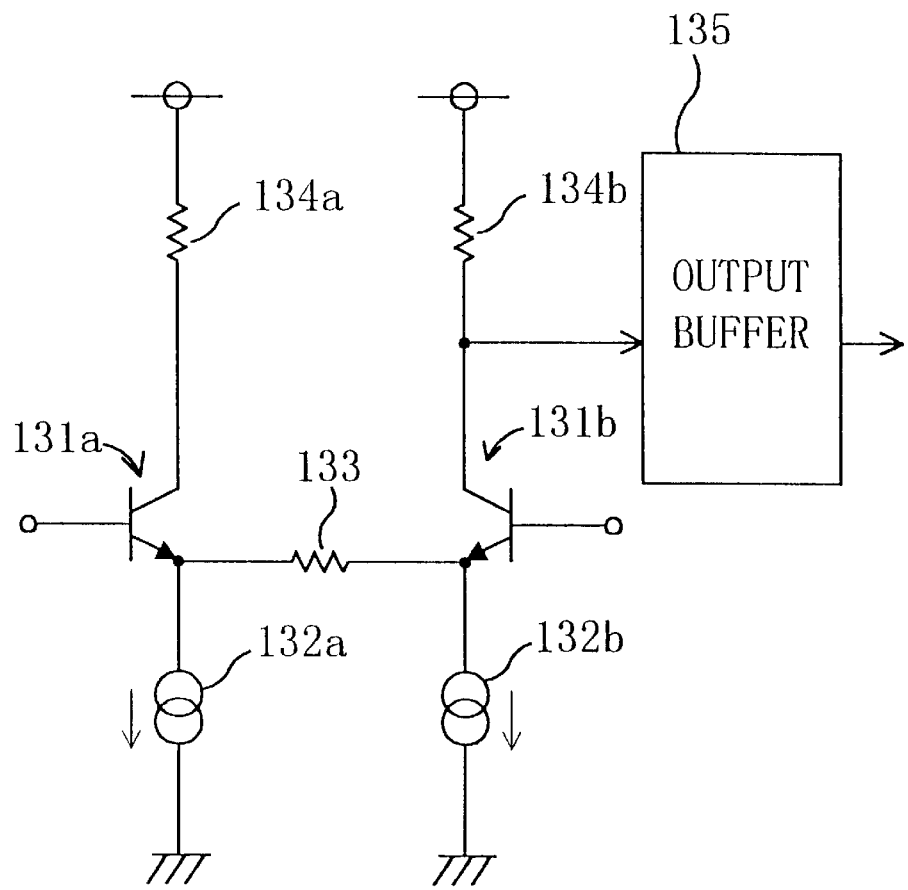
FIG. 7 is a circuit diagram showing an example of a structure of a differential amplifier used for the two-step parallel A/D converter according to the second embodiment of the present invention.

FIG. 7 is a circuit diagram showing an example of structures of the first to fourth differential amplifiers 116a, 116b, 116c and 116d. Each differential amplifier serves to amplify a difference voltage between an input voltage and a reference voltage, and to output the amplified difference voltage in addition to an output voltage obtained when the difference voltage is 0 V. As shown in FIG. 7, the differential amplifier is generally formed by transistors 131a and 131b, constant current sources 132a and 132b, an emitter resistor 133, load resistors 134a and 134b, and an output buffer 135.

Assuming that a gain of each differential amplifier is represented by A, an output voltage obtained when the difference voltage between the input voltage and the reference voltage of the differential amplifier is 0 V is represented by $V_O$, the high level reference voltage $V_{LH}$ for lower bit conversion output from the second differential amplifier 116b is represented by the upper limit voltage $V_{HH}$, the median voltage $V_{HM}$ and the lower limit voltage $V_{HL}$ of the reference voltage range which is obtained by the upper bit converting section 141 and to which the voltage $V_{IN}$ of the analog signal belongs.

$$V_{LH} = V_O + A\ (V_{HH} - V_{HM}) \tag{1}$$

The low level reference voltage $V_{LL}$ for lower bit conversion output from the third differential amplifier 116c is represented by the following equation.

$$V_{LL} = V_O + A\ (V_{HL} - V_{HM}) \tag{2}$$

Accordingly, a difference between the high level reference voltage $V_{LH}$ for lower bit conversion and the low level reference voltage $V_{LL}$ for lower bit conversion is obtained by the equations (1) and (2).

$$V_{LH} - V_{LL} = A\ (V_{HH} - V_{HL}) \tag{3}$$

More specifically, the difference voltage between the upper limit voltage $V_{HH}$ and the lower limit voltage $V_{HL}$ of the reference voltage range which is determined by the upper bit converting section 141 and to which the voltage $V_{IN}$ of the analog signal belongs is multiplied by A by means of the second and third differential amplifiers 116b and 116c, and is transmitted to the high level reference voltage terminal for lower bit conversion 109 and the low level reference voltage terminal for lower bit conversion 110.

In an optional reference voltage range of the upper bit converting section 141, a difference between the upper limit voltage and the median voltage and a difference between the lower limit voltage and the median voltage are constant.

$$V_{HH} - V_{HM} = \text{constant}$$

$$V_{HL} - V_{HM} = \text{constant}$$

Consequently, the following equations are obtained on the basis of the equations (1) and (2).

$$V_{LH} = \text{constant} \tag{4}$$

$$V_{LL} = \text{constant} \tag{5}$$

In other words, the high level reference voltage $V_{LH}$ for lower bit conversion and the low level reference voltage $V_{LL}$ for lower bit conversion are always kept constant irrespective of the voltage $V_{IN}$ of the input analog signal.

The first differential amplifier 116a inputs, through the switching means 120, the voltage $V_{IN}$ of the analog signal held by the sample-and-hold circuit 104 and the median voltage $V_{HM}$ of the reference voltage range which is obtained by the upper bit converting section 141 and to which the voltage $V_{IN}$ belongs, and amplifies the voltage $V_{IN}$ on the basis of the median voltage $V_{HM}$ of the reference voltage range to which the voltage $V_{IN}$ belongs and outputs the amplified voltage as an input voltage $V_{LIN}$ of the lower bit converting section 142.

The switching means 120 will be described below in more detail.

Figure 8:
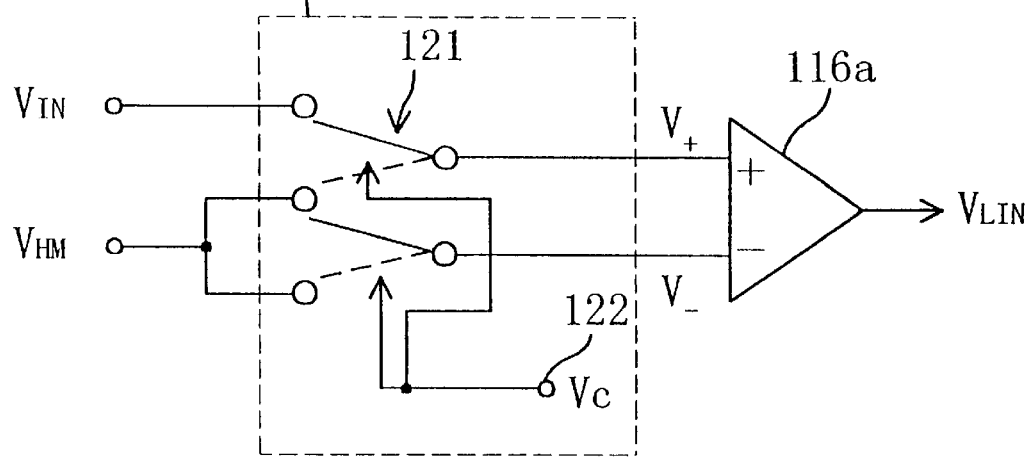
FIG. 8 is a circuit diagram showing an example of a structure of switching means used for the two-step parallel A/D converter according to the second embodiment of the present invention.

FIG. 8 is a circuit diagram showing a structure of the switching means 120. As shown in FIG. 8, the switching means 120 is formed by a switch 121 and a control signal input terminal 122. The switch 121 has three input terminals and two output terminals. The voltage $V_{IN}$ held by the sample-and-hold circuit 104 is input to one of the input terminals, and the median voltage $V_{HM}$ of the reference voltage range to which the voltage $V_{IN}$ belongs is input to the other input terminals. A + side input voltage V+ is output as a voltage for amplification of the first differential amplifier 116a from one of the output terminals, and a − side input voltage V− is output as a reference voltage of the first differential amplifier 116a from the other output terminal. A control signal $V_c$ for controlling the switch 121 is input to the control signal input terminal 122.

Figure 9:
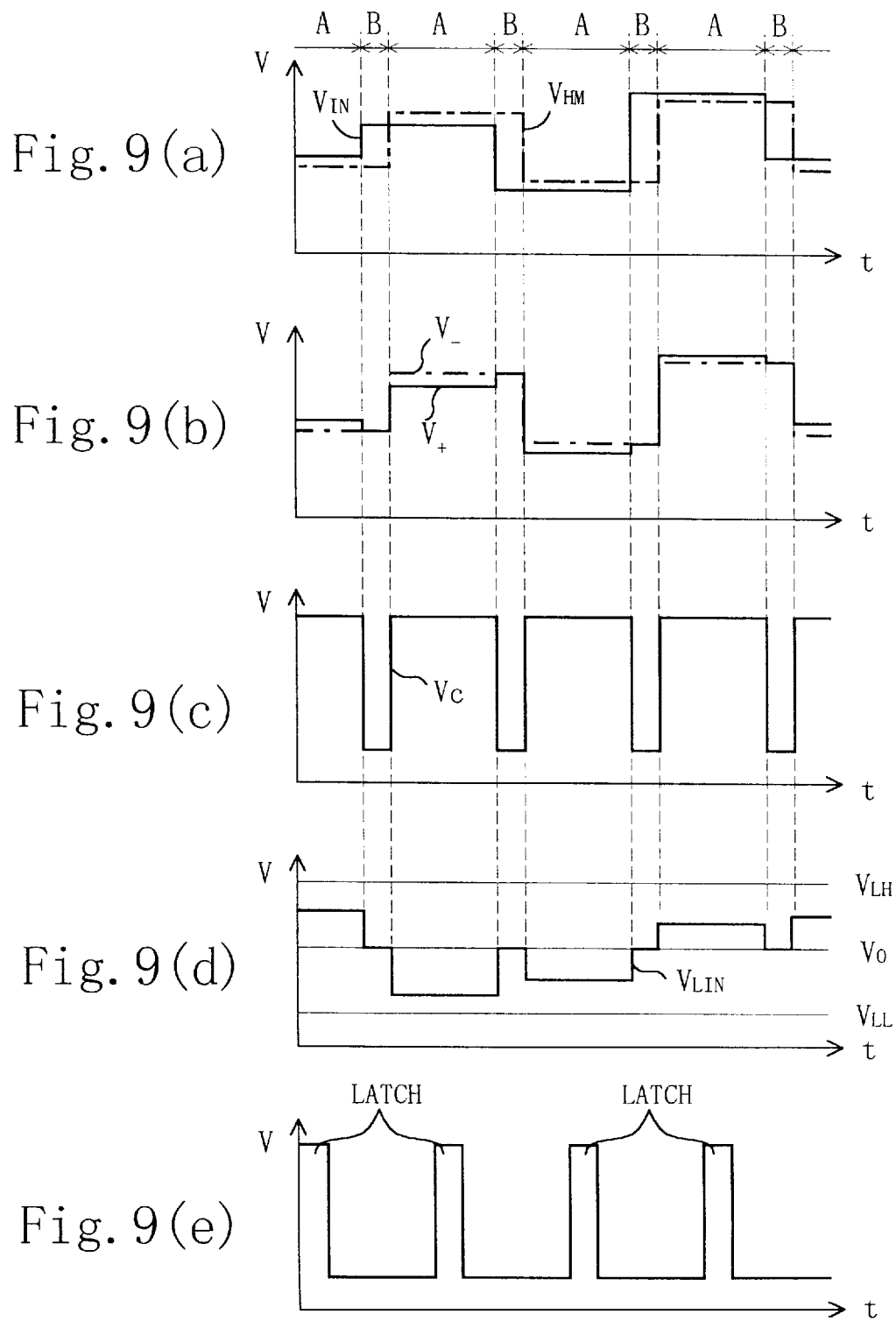
FIGS. 9(a) to 9(e) are timing charts for explaining the operation of the two-step parallel A/D converter according to the second embodiment of the present invention, in which the switching means shown in FIG. 8 is used.

FIGS. 9(a) to 9(e) are diagrams for explaining the operation of the two-step parallel A/D converter according to the present embodiment using the switching means 120 shown in FIG. 8. FIG. 9(a) is a graph showing a change of the voltage $V_{IN}$ of the analog signal held by the sample-and-hold circuit 104 and the median voltage $V_{HM}$ of the reference voltage range to which the voltage $V_{IN}$ belongs. FIG. 9(b) is a graph showing a change of the + side input voltage V+ and the − side input voltage V− of the first differential amplifier 116a. FIG. 9(c) is a graph showing the control signal $V_c$ for controlling the switches 121. FIG. 9(d) is a graph showing the input voltage $V_{LIN}$ of the lower bit converting section 142 which is output from the first differential amplifier 116a. FIG. 9(e) is a graph showing an operating timing of the comparator for lower bit conversion 112.

The median voltage $V_{HM}$ of the reference voltage range to which the voltage $V_{IN}$ of the analog signal belongs passes through the analog switch 107 operating according to a result of operation obtained by the comparator for upper bit conversion 106, and therefore is delayed more than the voltage $V_{IN}$. For this reason, a period (A) where the voltage $V_{IN}$ of the analog signal and the median voltage $V_{HM}$ of the reference voltage range to which the voltage $V_{IN}$ belongs are coincident with each other and a period (B) where they are not coincident with each other are generated as shown in FIG. 9(a).

The control signal $V_c$ shown in FIG. 9(c) is input to the control signal input terminal 122 of the switching means 120 to cause the switches 121 to perform switching operation. In the period (A), the control signal $V_c$ is set to the "H" level to control the switches 121 as shown by a solid line in FIG. 8. In the period (B), the control signal $V_c$ is set to the "L" level to control the switches 121 as shown by a broken line in FIG. 8.

As shown in FIG. 9(b), the voltage $V_{IN}$ of the analog signal and the median voltage $V_{HM}$ of the reference voltage range to which the voltage $V_{IN}$ belongs are input as the + side input voltage V+ and the − side input voltage V− to the first differential amplifier 116a respectively in the period (A) where the voltage $V_{IN}$ of the analog signal is coincident with the median voltage $V_{HM}$ of the reference voltage range to which the voltage $V_{IN}$ belongs.

In the period (B) where the voltage $V_{IN}$ of the analog signal is not coincident with the median voltage $V_{HM}$ of the reference voltage range to which the voltage $V_{IN}$ belongs, the median voltage $V_{HM}$ of the reference voltage range to which the voltage $V_{IN}$ belongs is input as the + side input voltage V+ and the − side input voltage V− to the first differential amplifier 116a.

As shown in FIG. 9(d), consequently, the input voltage $V_{LIN}$ of the lower bit converting section 142 which is output from the first differential amplifier 116a acts as a voltage obtained by amplifying the voltage $V_{IN}$ of the analog signal on the basis of the median voltage $V_{HM}$ of the reference voltage range to which the voltage $V_{IN}$ belongs in the period (A), and acts as an output voltage obtained when a difference voltage between the + side input voltage V+ and the − side input voltage V− is 0 in the period (B).

The foregoing will be described below by using equations. In the same manner as in other differential amplifiers, a gain of the first differential amplifier 116a is represented by A, and an output voltage obtained when the difference voltage between the input voltage and the reference voltage is 0 V is represented by $V_O$. In a period (A) where the voltage $V_{IN}$ of the analog signal is coincident with the median voltage $V_{HM}$ of the reference voltage range to which the voltage $V_{IN}$ belongs, the input voltage $V_{LIN}$ of the lower bit converting section 142 which is output from the first differential amplifier 116a is represented as follows.

$$V_{LIN} = V_O + A\ (V_{IN} - V_{HM}) \quad (6)$$

Accordingly, a difference between the high level reference voltage $V_{LH}$ for lower bit conversion and the input voltage $V_{LIN}$ of the lower bit converting section 142, and a difference between the input voltage $V_{LIN}$ of the lower bit converting section 142 and the low level reference voltage $V_{LL}$ for lower bit conversion are obtained on the basis of the equations (1), (2) and (6).

$$V_{LH} V_{LIN} = A\ (V_{HH} - V_{IN}) \quad (7)$$

$$V_{LIN} - V_{LL} = A\ (V_{IN} - V_{HL}) \quad (8)$$

While a relative relationship between the voltage $V_{IN}$ of the analog signal and the upper limit voltage $V_{HH}$ and lower limit voltage $V_{LH}$ of the reference voltage range to which the voltage $V_{IN}$ belongs is kept, only the difference voltage is amplified by A times and the amplified voltage is transmitted to the lower bit converting section 142. Accordingly, voltage resolution required for the comparator for lower bit conversion 112 is relieved by A times.

In a period (B) where the voltage $V_{IN}$ of the analog signal is not coincident with the median voltage $V_{HM}$ of the reference voltage range to which the voltage $V_{IN}$ belongs, the input voltage $V_{LIN}$ of the lower bit converting section 142 which is output from the first differential amplifier 116a is an output voltage obtained when the input difference voltage is 0 V, that is, the median voltage $V_O$ between the high level reference voltage $V_{LH}$ and the low level reference voltage $V_{LL}$ for lower bit conversion.

$$V_{LIN} = V_O \quad (9)$$

Thus, the input voltage $V_{LIN}$ of the lower bit converting section 142 is always present between the high level reference voltage $V_{LH}$ and the low level reference voltage $V_{LL}$ for lower bit conversion. During a transition from the period (B) to the period (A), a transient phenomenon having a great change in a voltage is not generated. As described above, the high level reference voltage $V_{LH}$ and the low level reference voltage $V_{LL}$ for lower bit conversion is always constant. For example, also in the case where a period from high-speed operation of the two-step parallel A/D converter for a transition from the period (B) to the period (A) to latch operation of the comparator for lower bit conversion 112 is short as shown in FIG. 9(e), the lower bit converting section 142 operates stably and lower bits obtained by the operation have no error.

Figure 10:
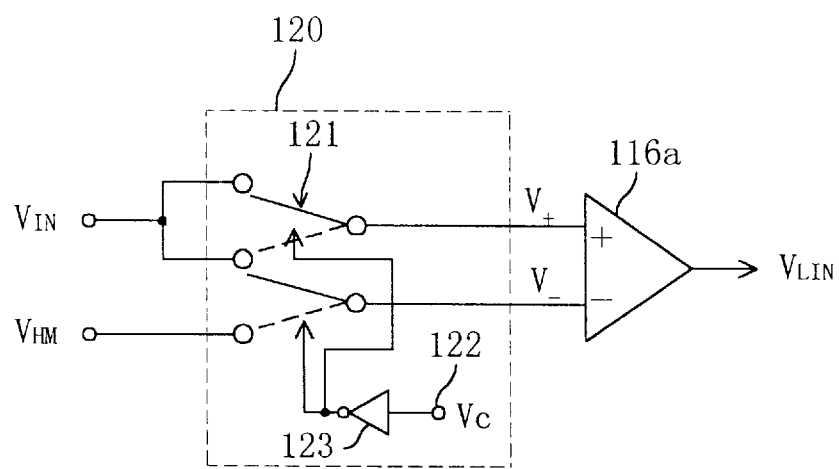
FIG. 10 is a circuit diagram showing another example of the structure of the switching means used for the two-step parallel A/D converter according to the second embodiment of the present invention.

The switching means 120 may have a structure shown in FIG. 10. In the switching means 120 shown in FIG. 10, the voltage $V_{IN}$ of the analog signal held by the sample-and-hold circuit 104 is input to two upper input terminals of the switch 121, and the median voltage $V_{HM}$ of the reference voltage range to which the voltage $V_{IN}$ belongs is input to the other input terminal. The control signal $V_c$ input to the control signal input terminal 122 is inverted by an inverter 123 and is then sent to the switch 121.

Figure 11:
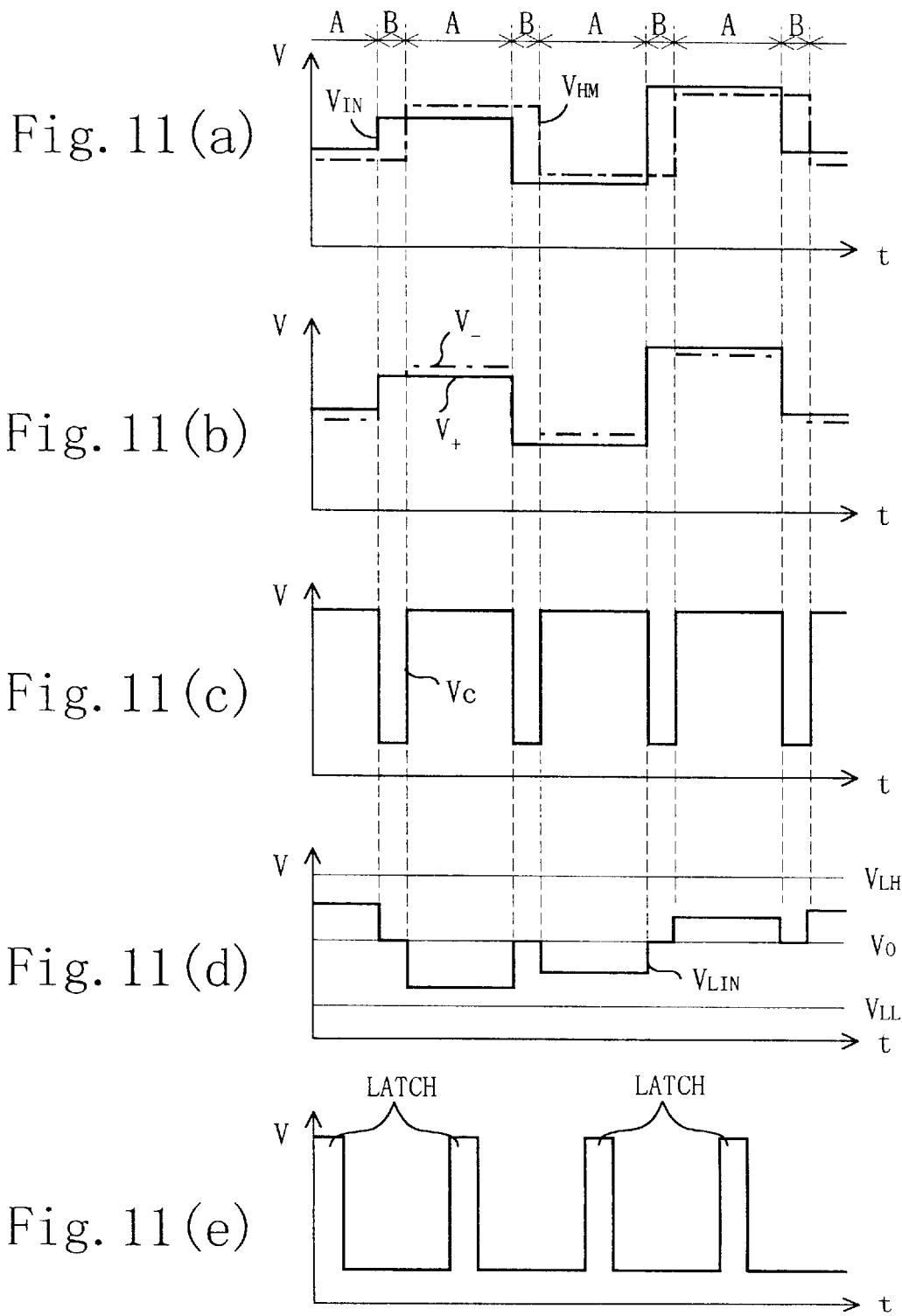
FIGS. 11(a) to 11(e) are timing charts for explaining the operation of the two-step parallel A/D converter according to the second embodiment of the present invention, in which the switching means shown in FIG. 10 is used.

FIGS. 11(a) to 11(e) are diagrams for explaining the operation of the two-step parallel A/D converter according to the present embodiment using the switching means 120 shown in FIG. 10. In the same manner as in FIGS. 9(a) to 9(e), FIG. 11(a) is a graph showing a change of the voltage $V_{IN}$ of the analog signal held by the sample-and-hold circuit 104 and the median voltage $V_{HM}$ of the reference voltage range to which the voltage $V_{IN}$ belongs. FIG. 11(b) is a graph showing a change of the + side input voltage V+ and the − side input voltage V− of the first differential amplifier 116a. FIG. 11(c) is a graph showing the control signal $V_c$ for controlling the switches 121. FIG. 11(d) is a graph showing the input voltage $V_{LIN}$ of the lower bit converting section 142 which is output from the first differential amplifier 116a. FIG. 11(e) is a graph showing an operating timing of the comparator for lower bit conversion 112.

As is apparent from FIGS. 11(a) to 11(e), in a period (B) where the voltage $V_{IN}$ of the analog signal is not coincident with the median voltage $V_{HM}$ of the reference voltage range to which the voltage $V_{IN}$ belongs, the control signal $V_c$ is inverted by the inverter 123 so that the switch 121 is set as shown by a solid line in FIG. 10 and the voltage $V_{IN}$ is input as a + side input voltage V+ and a − side input voltage V− to the first differential amplifier 116a. Except for this point, FIGS. 11(a) to 11(e) are identical to FIGS. 9(a) to 9(e) and the two-step parallel A/D converter according to the present embodiment using the switching means 120 shown in FIG. 10 operates in the same manner as in the case where the switching means 120 shown in FIG. 8 is used.

In FIG. 6, the fourth differential amplifier 116d inputs the median voltage $V_{HM}$ of the reference voltage range to which the voltage $V_{IN}$ of the analog signal belongs as the + side input voltage and the − side input voltage, and gives an output voltage to an intermediate point of the high level reference voltage terminal for lower bit conversion 109 and the low level reference voltage terminal for lower bit conversion 110. The output voltage of the fourth differential amplifier 116d is input, to the lower bit converting section 142, as a median reference voltage of a voltage range from the high level reference voltage $V_{LH}$ to the low level reference voltage $V_{LL}$.

The fourth differential amplifier 116d has another output line 125 than an output line for sending an output voltage to the tap resistor for lower bit conversion 111. The output line 125 is connected to an output line of the first differential amplifier 116a through a resistor 124.

Consequently, the following structure can be obtained. The second differential amplifier 116b for outputting the high level reference voltage $V_{LH}$ for lower bit conversion and the third differential amplifier 116c for outputting the low level reference voltage $V_{LL}$ for lower bit conversion have an impedance of the tap resistor for lower bit conversion 111 for the fourth differential amplifier 116d. Correspondingly, the first differential amplifier 116a for outputting the input voltage $V_{LIN}$ of the lower bit converting section 142 also has the same impedance for the fourth differential amplifier 116d by the resistor 124. Thus, a relative relationship between the voltage $V_{IN}$ of the analog signal in the upper bit converting section 141 and the reference voltage range to which the voltage $V_{IN}$ belongs is transmitted to the lower bit converting section 142 without error.

In the lower bit converting section 142, the comparator for lower bit conversion 112 compares the voltage $V_{LIN}$ input from the first differential amplifier 116a with each reference voltage signal obtained by dividing more finely a voltage between the high level reference voltage terminal for lower bit conversion 109 and the low level reference voltage terminal 110 for lower bit conversion by the tap resistor for lower bit conversion 111. Consequently, the reference voltage range to which the input voltage $V_{LIN}$ belongs is obtained. In this case, in the period (the period (A) in FIGS. 9 and 11) where the voltage $V_{IN}$ of the analog signal is coincident with the median voltage $V_H$, of the reference voltage range to which the voltage $V_{IN}$ belongs, the voltage output from the first differential amplifier 116a, that is, the voltage $V_{IN}$ of the analog signal aims at the voltage amplified on the basis of the median voltage $V_{HM}$ of the reference voltage range to which the voltage $V_{IN}$ belongs.

In accordance with the obtained reference voltage range, the lower bit coding circuit 113 codes lower bits of a digital signal indicative of the input analog signal $V_{IN}$. The output buffer circuit 114 adds upper bits coded by the upper bit coding circuit 108 and the lower bits coded by the lower bit coding circuit 113, and outputs them through the digital signal output terminal 115.

While voltages obtained by differentially amplifying the upper limit voltage, the lower limit voltage and the median voltage of the reference voltage range to which the voltage of the analog signal belongs have been used as the high level reference voltage, the low level reference voltage and their median voltage for lower bit conversion in the present embodiment, the present invention is not restricted thereto but an upper limit voltage, a lower limit voltage and a median voltage of an optional reference voltage range in the upper bit converting section 141 may be used as the high level reference voltage, the low level reference voltage and their median voltage for lower bit conversion.

Figure 12:
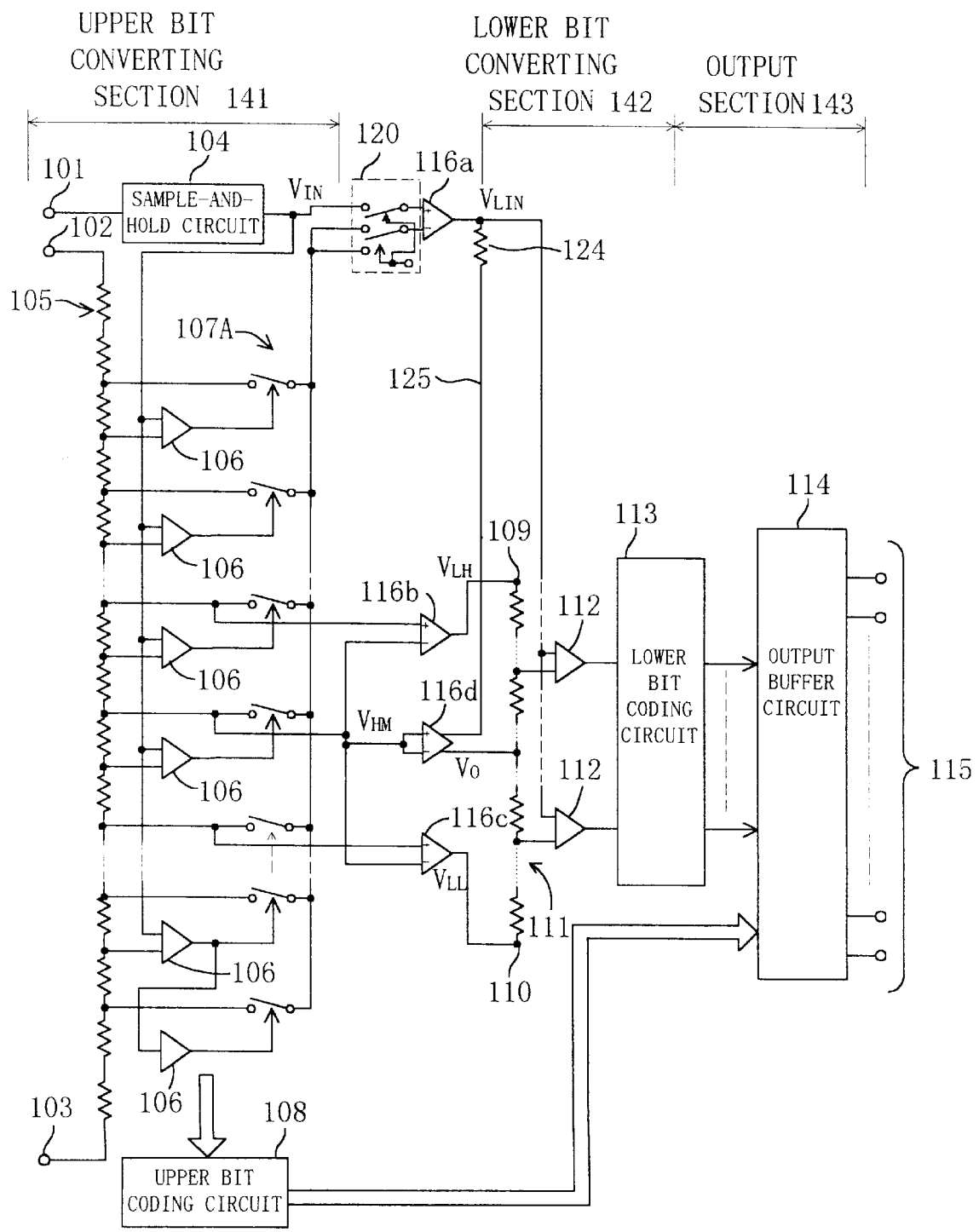
FIG. 12 is a circuit diagram showing a structure of a two-step parallel A/D converter according to another embodiment of the present invention.

FIG. 12 is a circuit diagram showing a whole structure of a two-step parallel AID converter according to another embodiment of the present invention, in which voltages obtained by differentially amplifying an upper limit voltage, a lower limit voltage and a median voltage of a predetermined reference voltage range in the upper bit converting section 141 are used as a high level reference voltage, a low level reference voltage and their median voltage for lower bit conversion. In FIG. 12, the same components as those of the two-step parallel A/D converter shown in FIG. 6 have the same reference numerals as in FIG. 6. Except that the voltages obtained by differentially amplifying the upper limit voltage, the lower limit voltage and the median voltage of the predetermined reference voltage range in the upper bit converting section 141 are used as the high level reference voltage, the low level reference voltage and their median voltage for lower bit conversion, the two-step parallel A/D converter shown in FIG. 12 has the same structure as that of the two-step parallel A/D converter shown in FIG. 6 and the same effects as in the two-step parallel A/D converter shown in FIG. 6 can be obtained.

Although the present invention has fully been described by way of example with reference to the accompanying drawings, it is to be understood that various changes and modifications will be apparent to those skilled in the art. Therefore, unless otherwise such changes and modifications depart from the scope of the invention, they should be construed as being included therein.

We claim:

1. A two-step parallel A/D converter for performing A/D conversion of an input analog signal by upper bit conversion and lower bit conversion, comprising:

means for expanding a first voltage range for the upper bit conversion to set a second voltage range for the lower bit conversion by amplifying upper and lower limit voltages of the first voltage range on the basis of a median voltage thereof, irrespective of a voltage of the input analog signal.

2. A two-step parallel A/D converter for performing A/D conversion of an input analog signal by upper bit conversion and lower bit conversion, comprising:

means for obtaining a high level reference voltage for lower bit conversion by amplifying an upper limit voltage of a voltage range for lower bit conversion on the basis of a median voltage of the voltage range;

means for obtaining lower level reference voltage for lower bit conversion by amplifying a lower limit voltage of the voltage range on the basis of the median voltage of the voltage range; and means for obtaining lower bit data depending on a position between the high level reference voltage and the low level reference voltage occupied by a voltage obtained by amplifying a voltage of the analog signal on the basis of the median voltage of the voltage range.

3. A two-step parallel A/D converter for performing A/D conversion of an input analog signal by upper bit conversion and lower bit conversion, comprising:

an upper bit converting section for dividing a portion between a predetermined high level reference voltage and a predetermined low level reference voltage into a plurality of reference voltage ranges, obtaining a reference voltage range to which a voltage of the analog signal belongs from the reference voltage ranges obtained by the division, generating and outputting bit data indicative of the obtained reference voltage range as upper bit data, and outputting an upper limit voltage, a lower limit voltage and a median voltage of a voltage range for lower bit conversion determined on the basis of the obtained reference voltage range;

a first differential amplifier for inputting the analog signal and the median voltage of the voltage range for lower bit conversion which is output from the upper bit converting section and amplifying the voltage of the analog signal on the basis of the median voltage;

a second differential amplifier having the same gain as that of the first differential amplifier, serving to input the upper limit voltage and the median voltage of the voltage range for lower bit conversion which is output from the upper bit converting section and to amplify the upper limit voltage on the basis of the median voltage;

a third differential amplifier having the same gain as those of the first and second differential amplifiers, serving to input the lower limit voltage and the median voltage of the voltage range for lower bit conversion which is output from the upper bit converting section and to amplify the lower limit voltage on the basis of the median voltage; and a lower bit converting section for setting an output voltage of the second differential amplifier to a high level reference voltage for lower bit conversion, setting an output voltage of the third differential amplifier to a low level reference voltage for lower bit conversion, dividing a portion between the high level reference voltage and the lower level reference voltage into a plurality of reference voltage ranges, obtaining a reference voltage range to which the output voltage of the first differential amplifier belongs from the reference voltage ranges obtained by the division, and generating and outputting, as lower bit data, bit data indicative of the obtained reference voltage range.

4. The two-step parallel A/D converter of claim 3, further comprising a fourth differential amplifier having the same gain as those of the first to third differential amplifiers, and serving to amplify the median voltage of the voltage range for lower bit conversion which is output from the upper bit converting section, on the basis of the median voltage, an output voltage of the fourth differential amplifier being input, to the lower bit converting section, as a median reference voltage of a voltage range from the high level reference voltage to the low level reference voltage for lower bit conversion.

5. The two-step parallel A/D converter of claim 3, wherein the upper bit converting section serves to output an upper limit voltage, a lower limit voltage and a median voltage of a predetermined voltage range and a median voltage of a voltage range for lower bit conversion in place of the upper limit voltage, the lower limit voltage and the median voltage of the voltage range for lower bit conversion, the second differential amplifier serves to input the upper limit voltage and the median voltage of the predetermined voltage range which are output from the upper bit converting section, and to amplify the upper limit voltage on the basis of the median voltage, and the third differential amplifier serves to input the lower limit voltage and the median voltage of the predetermined voltage range which are output from the upper bit converting section, and to amplify the lower limit voltage on the basis of the median voltage.

6. The two-step parallel A/D converter of claim 3, wherein the upper bit converting section serves to compare each median voltage of the reference voltage ranges obtained by the division with the voltage of the analog signal to select two adjacent reference voltage ranges, in which the voltage of the analog signal is higher than the median voltage of one reference voltage range and lower than the median voltage for the other, and to set bit data indicative of one of the two adjacent reference voltage ranges to upper bit data and to obtain a voltage range for lower bit conversion by adding the two adjacent reference voltage ranges.

7. The two-step parallel A/D converter of claim 6, wherein the upper bit converting section serves to output, as the upper bit data, bit data indicative of a lower voltage range of the two adjacent reference voltage ranges, the two-step parallel A/D converter serving to perform correction by adding "1" to the upper bit data output from the upper bit converting section when MSB of the lower bit data output from the lower bit converting section is "1".

8. The two-step parallel A/D converter of claim 3, wherein the upper bit converting section includes an upper buffer for latching and outputting the generated upper bit data in response to a given pulse signal, and the lower bit converting section includes a lower buffer for latching and outputting the generated lower bit data in response to a given pulse signal, the two-step parallel A/D converter further comprising a lower-upper buffer for latching and outputting the upper bit data output from the upper buffer and the lower bit data output from the lower buffer in response to a given pulse signal.

9. A two-step parallel A/D converter for performing A/D conversion of an input analog signal by upper bit conversion and lower bit conversion, comprising:

an upper bit converting section for dividing a portion between a predetermined high level reference voltage and a predetermined low level reference voltage into a plurality of reference voltage ranges, obtaining a reference voltage range to which a voltage of the analog signal belongs from the reference voltage ranges obtained by the division, and coding upper bits according to the obtained reference voltage ranges;

a first differential amplifier for amplifying the voltage of the analog signal on the basis of a median voltage of the reference voltage range obtained by the upper bit converting section;

a second differential amplifier having the same gain as that of the first differential amplifier and serving to amplify an upper limit voltage of the reference voltage range on the basis of a median voltage of the reference voltage range obtained by the upper bit converting section;

a third differential amplifier having the same gain as those of the first and second differential amplifiers and serving to amplify a lower limit voltage of the reference voltage range on the basis of a median voltage of the reference voltage range obtained by the upper bit converting section; and a lower bit converting section for setting an output voltage of the second differential amplifier to a high level reference voltage for lower bit conversion, setting an output voltage of the third differential amplifier to a low level reference voltage for lower bit conversion, dividing a portion between the high level reference voltage and the low level reference voltage into a plurality of reference voltage ranges, obtaining a reference voltage range to which an output voltage of the first differential amplifier belongs from the reference voltage ranges obtained by the division, and coding lower bits in accordance with the obtained reference voltage ranges.

10. The two-step parallel A/D converter of claim 9, further comprising a fourth differential amplifier having the same gain as those of the first to third differential amplifiers and serving to amplify a median voltage of the reference voltage range obtained by the upper bit converting section on the basis of the same median voltage, an output voltage of the fourth differential amplifier being input, to the lower bit converting section, as a median reference voltage of a voltage range from the high level reference voltage to the low level reference voltage.

11. The two-step parallel A/D converter of claim 10, wherein the fourth differential amplifier has another output line than an output line for outputting a voltage to the lower bit converting section, the output line being connected to an output line of the first differential amplifier through a resistor.

12. The two-step parallel A/D converter of claim 9, further comprising switching means provided between the upper bit converting section and the first differential amplifier for switching, in accordance with a given control signal, a first state in which the median voltage of the reference voltage range obtained by the upper bit converting section is output as a reference voltage and the voltage of the analog signal is output as a voltage to be amplified to the first differential amplifier, and a second state in which the median voltage of the reference voltage range obtained by the upper bit converting section is output as the reference voltage and the voltage to be amplified to the first differential amplifier.

13. The two-step parallel A/D converter of claim 9, further comprising switching means provided between the upper bit converting section and the first differential amplifier for switching, in accordance with the given control signal, a first state in which the median voltage of the reference voltage range obtained by the upper bit converting section is output as a reference voltage and the voltage of the analog signal is output as a voltage to be amplified to the first differential amplifier, and a second state in which the voltage of the analog signal is output as the reference voltage and the voltage to be amplified to the first differential amplifier.

14. A two-step parallel A/D converter for performing A/D conversion of an input analog signal by upper bit conversion and lower bit conversion, comprising:

an upper bit converting section for dividing a portion between a predetermined high level reference voltage and a predetermined low level reference voltage into a plurality of reference voltage ranges, obtaining a reference voltage range to which a voltage of the analog signal belongs from the reference voltage ranges obtained by the division, and coding upper bits according to the obtained reference voltage range;

a first differential amplifier for amplifying the voltage of the analog signal on the basis of a median voltage of the reference voltage range obtained by the upper bit converting section;

a second differential amplifier having the same gain as that of the first differential amplifier and serving to amplify an upper limit voltage of the reference voltage range selected from the reference voltage ranges obtained by the division in the upper bit converting section on the basis of the median voltage of the reference voltage range;

a third differential amplifier having the same gain as those of the first and second differential amplifiers and serving to amplify a lower limit voltage of the reference voltage range selected from the reference voltage ranges obtained by the division in the upper bit converting section on the basis of the median voltage of the reference voltage range; and a lower bit converting section for setting an output voltage of the second differential amplifier to a high level reference voltage for lower bit conversion, setting an output voltage of the third differential amplifier to a low level reference voltage for lower bit conversion, dividing a portion between the high level reference voltage and the low level reference voltage into a plurality of reference voltage ranges, obtaining a reference voltage range to which an output voltage of the first differential amplifier belongs from the reference voltage ranges obtained by the division, and coding lower bits in accordance with the obtained reference voltage range.

15. The two-step parallel A/D converter of claim 14, further comprising a fourth differential amplifier having the same gain as those of the first to third differential amplifiers and serving to amplify a median voltage of the reference voltage range selected from the reference voltage ranges obtained by the division in the upper bit converting section on the basis of the median voltage, an output voltage of the fourth differential amplifier being input, to the lower bit converting section, as a median reference voltage of the voltage range from the high level reference voltage to the low level reference voltage.

16. The two-step parallel A/D converter of claim 15, wherein the fourth differential amplifier has another output line than an output line for outputting a voltage to the lower bit converting section, the output line being connected to an output line of the first differential amplifier through a resistor.

17. The two-step parallel A/D converter of claim 14, further comprising switching means provided between the upper bit converting section and the first differential amplifier for switching, in accordance with a given control signal, a first state in which the median voltage of the reference voltage range obtained by the upper bit converting section is output as a reference voltage and the voltage of the analog signal is output as a voltage to be amplified to the first differential amplifier, and a second state in which the median voltage of the reference voltage range obtained by the upper bit converting section is output as the reference voltage and the voltage to be amplified to the first differential amplifier.

18. The two-step parallel A/D converter of claim 14, further comprising switching means provided between the upper bit converting section and the first differential amplifier for switching, in accordance with the given control signal, a first state in which the median voltage of the reference voltage range obtained by the upper bit converting section is output as a reference voltage to the first differential amplifier and the voltage of the analog signal is output as a voltage to be amplified to the first differential amplifier, and a second state in which the voltage of the analog signal is output as the reference voltage and the voltage to be amplified to the first differential amplifier.

* * * * *